(12) United States Patent
Choi et al.

(10) Patent No.: US 10,222,834 B2
(45) Date of Patent: Mar. 5, 2019

(54) FLEXIBLE DISPLAY DEVICE

(71) Applicant: Samsung Display Co., Ltd, Yongin-si, Gyeonggi-do (KR)

(72) Inventors: Suk Choi, Hwaseong-si (KR); Heeyoung Lee, Suwon-si (KR); Jongin Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/455,761

(22) Filed: Mar. 10, 2017

(65) Prior Publication Data
US 2017/0262022 A1 Sep. 14, 2017

(30) Foreign Application Priority Data

Mar. 11, 2016 (KR) .................. 10-2016-0029748

(51) Int. Cl.
G06F 1/16 (2006.01)
G02B 5/30 (2006.01)

(52) U.S. Cl.
CPC ......... G06F 1/1652 (2013.01); G02B 5/3025 (2013.01); G02B 5/3083 (2013.01); *H01L 2251/5338* (2013.01)

(58) Field of Classification Search
CPC ... G06F 1/1652; G02B 5/3083; G02B 5/3025; G02F 1/13363; G02F 1/133634; G02F 1/133637; G02F 1/133638; G02F 1/133528
USPC .......... 359/489.07, 489.15, 489.17; 349/117–119
See application file for complete search history.

(56) References Cited

U.S. PATENT DOCUMENTS

| 8,946,985 | B2* | 2/2015 | Kang | ............... H01H 1/10 313/511 |
| 8,947,368 | B2* | 2/2015 | Jeong | ............... G02F 1/13338 345/156 |
| 9,141,238 | B2* | 9/2015 | Kang | ............... G06F 3/041 |
| 2011/0211135 | A1* | 9/2011 | Sharp | ............... G02B 27/2264 349/15 |
| 2013/0194205 | A1* | 8/2013 | Park | ............... G06F 3/044 345/173 |
| 2013/0293096 | A1* | 11/2013 | Kang | ............... H01H 1/10 313/511 |
| 2013/0300677 | A1* | 11/2013 | Kim | ............... G06F 3/0414 345/173 |

(Continued)

FOREIGN PATENT DOCUMENTS

KR 10-2009-0054746 A 6/2009
KR 10-2011-0039189 A 4/2011

(Continued)

*Primary Examiner* — Frank G Font
(74) *Attorney, Agent, or Firm* — Innovation Counsel LLP

(57) ABSTRACT

A flexible display device includes a bending area including a display panel, an optical member, a polarization member, and a window member, and a non-bending area. A bending part of the optical member includes a plurality of optical patterns corresponding to the bending area, and the plurality of optical patterns are provided to have different widths at a face adjacent to the display panel and a face adjacent to the polarization member. Light leakage phenomenon and color shift phenomenon induced by the modification of the optical member in the bending area during bending of the display device may be improved.

19 Claims, 19 Drawing Sheets

(56) References Cited

U.S. PATENT DOCUMENTS

| | | | |
|---|---|---|---|
| 2013/0335344 A1* | 12/2013 | Han | C09J 133/066 |
| | | | 345/173 |
| 2013/0342429 A1* | 12/2013 | Choi | H05K 13/00 |
| | | | 345/30 |
| 2015/0069346 A1* | 3/2015 | Kim | H01L 27/323 |
| | | | 257/40 |
| 2015/0200375 A1* | 7/2015 | Kim | G09F 9/301 |
| | | | 257/40 |
| 2015/0323719 A1 | 11/2015 | Hung et al. | |
| 2016/0037656 A1* | 2/2016 | Kim | G06F 1/1656 |
| | | | 361/749 |

FOREIGN PATENT DOCUMENTS

| | | |
|---|---|---|
| KR | 10-2011-0339189 A | 4/2011 |
| KR | 10-2013-0000310 A | 1/2013 |

* cited by examiner

FLEXIBLE DISPLAY DEVICE

CROSS-REFERENCE TO RELATED APPLICATIONS

This U.S. non-provisional patent application claims priority under 35 U.S.C. § 119 of Korean Patent Application No. 10-2016-0029748, filed on Mar. 11, 2016, the entire contents of which are hereby incorporated by reference.

BACKGROUND

The present disclosure herein relates to a flexible display device, and more particularly, to a flexible display device in which optical pattern shapes of optical members in a bending area and a non-bending area are different.

Display devices provide a user with information by displaying various images on a display screen. Recently, a flexible display device of which shape is capable of being changed to various shapes is being developed. The flexible display device is being developed in diverse shapes including a curved display device, a bending type display device, a foldable display device, a rollable display device, and a stretchable display device. Since the shape of the flexible display device may be changed to various shapes, portability and user convenience thereof may be improved.

SUMMARY

The present disclosure provides a flexible display device in which a bending part and a non-bending part have uniform optical properties irrespective of the modification of a shape of the display device according to a user mode.

The present disclosure also provides a flexible display device capable of minimizing optical distortion phenomenon induced by the modification of the shape of optical patterns when using the display device in a bending state, by modifying the shape of the optical patterns of an optical member included in the display device in consideration of a user mode of the display device and then applying.

The present disclosure also provides a flexible display device in which light leakage phenomenon and color shift phenomenon in a bending area of a display device are improved.

An embodiment of the inventive concept provides a flexible display device including a bending area and a non-bending area, wherein the flexible display device includes a display panel configured to provide images, an optical member disposed on the display panel, a polarization member disposed on the optical member, and a window member disposed on the polarization member. In a flexible display device according to an embodiment, the optical member includes an optical member bending part corresponding to the bending area and including a plurality of first optical patterns, and an optical member non-bending part corresponding to the non-bending area and including a plurality of second optical patterns. Each of the plurality of the first optical patterns includes a first face adjacent to the display panel and having a first width, a second face adjacent to the polarization member and having a second width which is different from the first width, and a side disposed between the first face and the second face.

In an embodiment, the display panel, the optical member, the polarization member and the window member may be bent with respect to a bending axis in a first mode, and unfolded in a second mode, and the display panel may be disposed closer to the bending axis than the window member in the first mode. In addition, each of the plurality of the first optical patterns may have the first width greater than the second width in the second mode.

In an embodiment, the display panel, the optical member, the polarization member and the window member may be bent with respect to a bending axis in a third mode, and unfolded in a fourth mode, and the window member may be disposed closer to the bending axis than the display panel in the third mode. In addition, each of the plurality of the first optical patterns may have the second width greater than the first width in the fourth mode.

In an embodiment, a cross section of each of the plurality of the first optical patterns which are perpendicular to one face of the display panel may be a trapezoid.

In an embodiment, a cross section of each of the plurality of the second optical patterns which are perpendicular to one face of the display panel may be a rectangle or a square.

In an embodiment, the display panel may include a plurality of pixels, the plurality of the first optical patterns may be disposed in one-to-one correspondence with the plurality of pixels in the bending area, and the plurality of the second optical patterns may be disposed in one-to-one correspondence with the plurality of pixels in the non-bending area.

In an embodiment, the plurality of the pixels may include a first pixel showing a first color, a second pixel showing a second color, and a third pixel showing a third color; the plurality of the first optical patterns may include a first sub optical pattern disposed corresponding to the first pixel, a second sub optical pattern disposed corresponding to the second pixel, and a third sub optical pattern disposed corresponding to the third pixel; and heights of the first, second, and third sub optical patterns may be different from each other.

In an embodiment, the plurality of the pixels may include a first pixel showing a first color, a second pixel showing a second color, and a third pixel showing a third color; the plurality of the first optical patterns may include a first sub optical pattern disposed corresponding to the first pixel, a second sub optical pattern disposed corresponding to the second pixel, and a third sub optical pattern disposed corresponding to the third pixel; the plurality of the second optical patterns may include a fourth sub optical pattern disposed corresponding to the first pixel, a fifth sub optical pattern disposed corresponding to the second pixel, and a sixth sub optical pattern disposed corresponding to the third pixel; the first sub optical pattern may have a greater phase difference value than the fourth sub optical pattern; the second sub optical pattern may have a greater phase difference value than the fifth sub optical pattern; and the third sub optical pattern may have a greater phase difference value than the sixth sub optical pattern.

In an embodiment, the first color, the second color, and the third color may be red, green, and blue, respectively. The heights of the first, second, and third sub optical patterns may be t1, t2, and t3, respectively, where t1>t2>t3.

In an embodiment, an angle between a transmission axis of the polarization member and an optical axis of the optical member may be from about 43 to about 47 degrees.

In an embodiment, the optical member may be a 2l4 retardation layer. In addition, the optical member may be a 2l4 reverse wavelength dispersible retardation layer.

In an embodiment, the flexible display device may further include a positive c plate between the optical member and the display panel.

In an embodiment, the flexible display device may further include a 212 retardation layer between the optical member and the polarization member.

In an embodiment, the flexible display device may further include a touch sensing unit between the display panel and the optical member.

In an embodiment, the flexible display device may further include at least one adhesive between the display panel and the polarization member.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
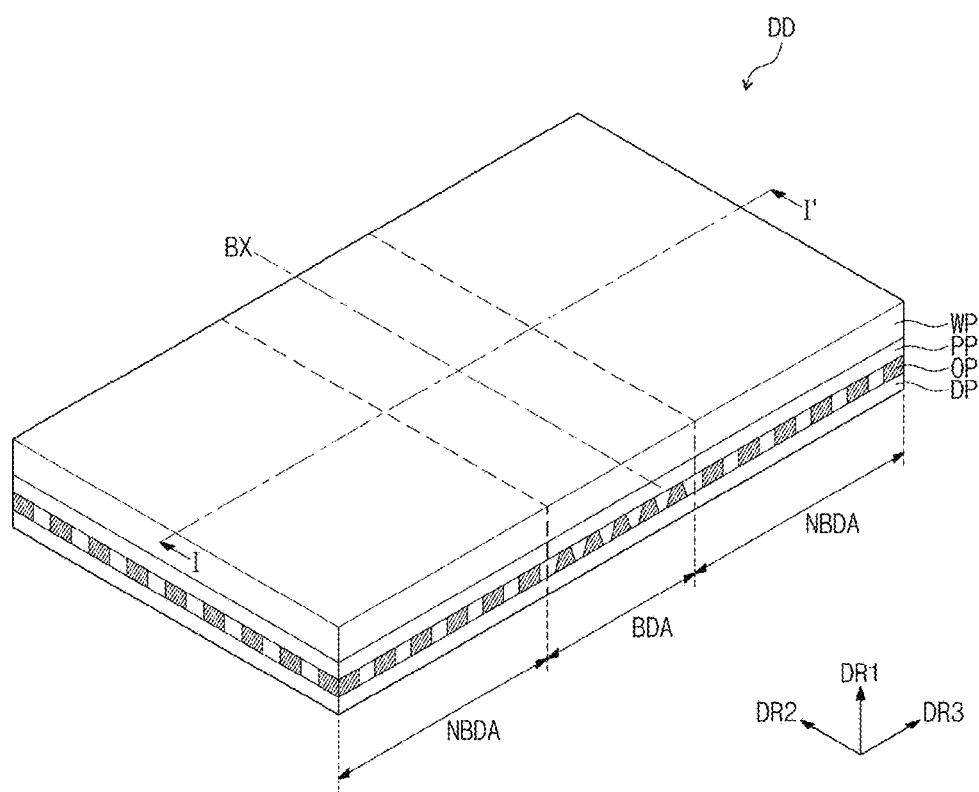
FIG. 1 is a perspective view of an unfolded state of a flexible display device according to an embodiment.

Exemplary embodiments of the inventive concept will be described below in more detail with reference to the accompanying drawings. The inventive concept may, however, be embodied in different forms and should not be construed as limited to the embodiments set forth herein. Rather, these embodiments may include alterations, equivalents, or substitutes, which are included in the scope and technical range of the inventive concept.

Like reference numerals refer to like elements throughout. In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element discussed below could be termed a second element without departing from the teachings of the inventive concept. As used herein, the singular forms, "a", "an" and "the" are intended to include the plural forms as well, unless the context clearly indicates otherwise.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being 'on' another part, it can be directly on the other part, or intervening layers may also be present. On the contrary, it will be understood that when a layer, a film, a region, a plate, etc. is referred to as being 'under' another part, it can be directly under, and one or more intervening layers may also be present.

Hereinafter, exemplary embodiments of the flexible display device according to an embodiment of the inventive concept will be described in detail with reference to the accompanying drawings.

Figure 2:
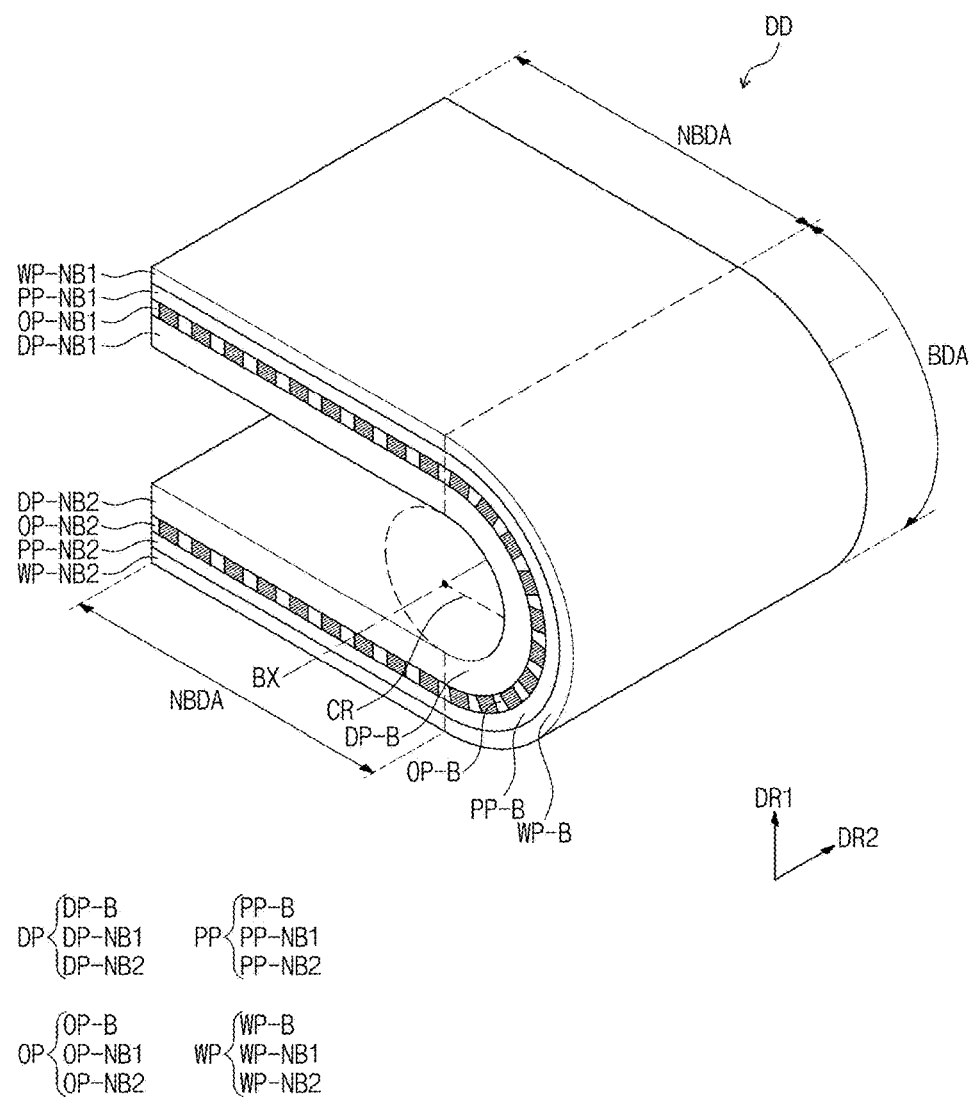
FIG. 2 is a perspective view of a bending state of a flexible display device according to an embodiment.

FIGS. 1 and 2 are perspective views of a flexible display device DD according to an embodiment of the inventive concept. FIG. 1 is a perspective view of an unfolded state of a flexible display device DD according to an embodiment. FIG. 2 is a perspective view of a bending state of the flexible display device DD according to an embodiment.

In FIGS. 1 and 2, a foldable display device is shown as an embodiment of the flexible display device DD. However, the flexible display device DD of the inventive concept is not limited thereto, and various types of display devices DD such as a curved display device, a bending type display device, and a stretchable display device may be applied. For example, the flexible display device DD according to an embodiment corresponds to a display device including a part of which shape is modified by a tensile force or a compressive force.

Even though not shown separately, the display device DD according to the inventive concept may be used in a large-sized electronic device such as a television, and an outdoor billboard, and a medium and small-sized electronic device such as a cellular phone, a personal computer, a laptop computer, a personal digital terminal, a car navigation unit, a game console, a portable electronic device, a wristwatch type electronic device, and a camera.

Referring to FIGS. 1 and 2, the flexible display device DD according to an embodiment may include a bending area BDA and a non-bending area NBDA. In the flexible display device DD, the bending area BDA and the non-bending area NBDA may be connected. For example, in an embodiment of FIGS. 1 and 2, the non-bending areas NBDA may be disposed at both sides of the bending area BDA.

The flexible display device DD according to an embodiment may include a display panel DP, an optical member OP disposed on the display panel DP, a polarization member PP disposed on the optical member OP, and a window member WP disposed on the polarization member PP. Referring to the unfolded state of the display device DD in FIG. 1, the display panel DP, the optical member OP, the polarization member PP, and the window member WP may be laminated one by one in a first direction DR1.

In FIG. 1 or 2, a bending axis BX may be an imaginary line extended in a second direction DR2. In an embodiment, each of the display panel DP, the optical member OP, the polarization member PP, and the window member WP may be bent with respect to the bending axis BX. Bending may mean modification or distortion of each member of the display device DD such as the display panel DP, the optical member OP, the polarization member PP, and the window member WP to a specific shape by an external force. Each of the display panel DP, the optical member OP, the polarization member PP, and the window member WP may have a bending part and a non-bending part.

In FIG. 2, the flexible display device DD may be folded so as to have a radius of curvature CR. The flexible display device DD of FIG. 2 has a completely folded state so that the non-bending areas NBDA may face to each other. However, an embodiment of the inventive concept is not limited thereto, and the bent degree may change according to the radius of curvature CR. In addition, in the case where the flexible display device DD is bent and used, the distance between facing non-bending areas NBDA may not be constant. That is, the flexible display device may be a flexible display device which is not completely folded but bent with a certain angle.

The display panel DP provides images. The display panel DP may be a flexible display panel. The display panel DP may include a flexible substrate. In this disclosure, flexible means bending properties, but not limited to bending to a completely folded structure, and includes a structure bent to a few degrees.

The display panel DP may include a display panel bending part DP-B which corresponds to the bending area BDA of the display device DD, and display panel non-bending parts DP-NB1 and DP-NB2, which correspond to the non-bending areas NBDA of the display device DD. The display panel bending part DP-B, and the display panel non-bending parts DP-NB1 and DP-NB2 may be connected with each other. In an embodiment, the display panel non-bending parts DP-NB1 and DP-NB2 may be in plural. For example, the display panel non-bending parts DP-NB1 and DP-NB2 may include a first display panel non-bending part DP-NB1 which is connected with one end of the display panel bending part DP-B, and a second display panel non-bending part DP-NB2 which is connected with another end of the display panel bending part DP-B.

In FIGS. 1 and 2, the display panel non-bending parts DP-NB1 and DP-NB2 may be disposed at both sides of the display panel bending part DP-B with respect to the display panel bending part DP-B. The display panel non-bending parts DP-NB1 and DP-NB2 may be symmetrically disposed with respect to the display panel bending part DP-B. However, an embodiment is not limited thereto, and the display panel non-bending parts DP-NB1 and DP-NB2 may be disposed at one side of the display panel bending part DP-B. Alternatively, the display panel bending part DP-B may be disposed between the display panel non-bending parts DP-NB1 and DP-NB2, where the display panel bending part DP-B may be inclined to one part of the display panel non-bending parts DP-NB1 and DP-NB2. For example, in the case where the display panel DP is bent with respect to the bending axis BX in FIG. 2, the areas of facing first display panel non-bending part DP-B and the second display panel non-bending part DP-NB2 after bending are the same. However, an embodiment of the inventive concept is not limited thereto. The area of the first display panel non-bending part DP-NB1 and the second display panel non-bending part DP-NB2 may be different from each other.

In addition, the distance between the first display panel non-bending part DP-NB1 and the second display panel non-bending part DP-NB2 with respect to the bending axis BX is constant in FIG. 2. However, an embodiment of the inventive concept is not limited thereto. The distance between the first display panel non-bending part DP-NB1 and the facing second display panel non-bending part DP-NB2 may not be constant. For example, the distance between facing non-bending areas NBDA may increase toward one end part of the display device.

The display panel DP providing images may display images on one face. For example, the display panel DP in FIG. 1 may provide images toward the first direction DR1. The display panel DP may display images without distinction of the display panel bending part DP-B and the display panel non-bending parts DP-NB1 and DP-NB2.

For example, the display panel DP of the flexible display device DD according to an embodiment may be an organic light emitting display panel. However, an embodiment of the inventive concept is not limited thereto. The display panel DP included in the flexible display device according to an embodiment may be a liquid crystal display panel, a plasma display panel, an electrophoretic display panel, a microelectromechanical system (MEMS) display panel, and an electrowetting display panel. The configuration of the display panel DP will be described in detail below.

On the display panel DP, the optical member OP may be disposed. The optical member OP may be disposed between the polarization member PP and the display panel DP. The optical member OP may include a plurality of optical patterns. The optical member OP may include an optical member bending part OP-B corresponding to the bending area BDA of the display device DD, and optical member non-bending parts OP-NB1 and OP-NB2 corresponding to the non-bending area NBDA of the display device DD. Each of the optical member bending part OP-B and the optical member non-bending parts OP-NB1 and OP-NB2 may be overlapped with the display panel bending part DP-B and the display panel non-bending parts DP-NB1 and DP-NB2, respectively.

Explanation on the display panel bending part and the display panel non-bending part may be also applied to the following optical member bending part and optical member non-bending part. The optical member non-bending parts OP-NB1 and OP-NB2 may be disposed at both sides of the optical member bending part OP-B with respect to the optical member bending part OP-B. The optical member non-bending parts OP-NB1 and OP-NB2 may be symmetrically disposed with respect to the optical member bending part OP-B. However, an embodiment of the inventive concept is not limited thereto, and the optical member non-bending parts OP-NB1 and OP-NB2 may be disposed only at one side of the optical member bending part OP-B. Alternatively, the optical member bending part OP-B may be disposed between the optical member non-bending parts OP-NB1 and OP-NB2, where the optical member bending part OP-B may be inclined to one side among the optical member non-bending parts OP-NB1 and OP-NB2.

The optical member OP may be a retarder having an optical anisotropy. The optical member OP may be a λ/4 retardation layer. For example, the optical member OP may be a λ/4 retardation layer having reverse wavelength dispersibility. The reverse wavelength dispersibility means that a retardation value decreases with the decrease of the wavelength of incident light, and a retardation value increases with the increase of the wavelength of incident light in at least the visible light region. For example, the flexible display device DD according to an embodiment may use the λ/4 retardation layer having reverse wavelength dispersibility, and in this case, the optical member OP may have a relatively uniform transmittance irrespective of the wavelength region of the incident light due to the reverse wavelength dispersibility.

For example, the optical member OP which is the λ/4 retardation layer having reverse wavelength dispersibility may have an in-plane phase difference value ($R_0$) of about 100 nm to about 200 nm. For example, the in-plane phase difference value ($R_0$) of the optical member OP may be represented by the following Equation 1.

$$R_o=(n_x-n_y) \times d \quad \text{[Equation 1]}$$

In Equation 1, $n_x$ and $n_y$ represent a refractive index in an x-axis and a refractive index in a y-axis, respectively, in the optical member OP, and d represents a thickness.

The retardation value (R) of the retardation layer is defined as $R=\Delta n \times d$, where $\Delta n$ represents double refractive index, and d represents the thickness of a wavelength plate. That is, the retardation value may be represented by the function values of the refractive index and the thickness, and the retardation value may be controlled by controlling the refractive index by changing a material for forming the retardation layer or the thickness of the retardation layer.

The optical member OP may be a retardation layer and may be patterned to accomplish appropriate phase difference delay by each wavelength region corresponding to the wavelength region of light displayed in each pixel of the display panel which will be described hereinafter.

The optical member OP which is the λ/4 retardation layer may transform linear polarization into circular polarization, or circular polarization into linear polarization. The optical member OP may be a double refraction film obtained by elongating a film of a polymer resin such as polycarbonate, polyvinyl alcohol, polystyrene, polymethylmethacrylate, polypropylene or other polyolefin, polyacrylate, and polyimide. In addition, the optical member OP may be an optical film having an aligned shape of a liquid crystal polymer.

In the case where the optical member OP is a reverse wavelength λ/4 retardation layer, a positive C plate (not shown) may be further included between the optical member OP and the display panel DP. The positive C plate is a uniaxial optical device satisfying a refractive index dispersion of nz>nx=ny (where each of nx, ny, and nz represents refractive index of a phase difference film in x-axis, y-axis, and z-axis, respectively). The positive C plate may be a solidified layer or a cured layer of a liquid crystal composition including a liquid crystal compound.

In an embodiment, in the case where the positive C plate is further included, color shift phenomenon may be further improved in addition to the improvement of reflectivity due to external light, which is improved by the polarization member PP and the optical member OP.

A λ/2 retardation layer may be further included between the optical member OP and the polarization member PP. The λ/2 retardation layer may change a polarization direction of linearly polarized light. For example, in the case where the optical member OP is a λ/4 retardation layer, and a λ/2 retardation layer is further included between the λ/4 retardation layer and the polarization member PP, the visibility of a display device may be improved by decreasing the reflectivity of external light.

The optical member OP may be a retardation layer manufactured by a separate process, and the retardation layer manufactured by the separate process may be transferred on the display panel DP and formed. In this case, an adhesive may be provided between the retardation layer and the display panel DP. Alternatively, the optical member OP may be provided by being directly coated on the display panel DP and forming a pattern. In the case where the optical member OP is provided on the display panel DP using a direct coating process, the adhesive may be omitted.

Meanwhile, the optical member OP may be formed by transferring on the polarization member PP. The optical member OP of the retardation layer manufactured by the separate process may be provided on the polarization member PP via transcription. In this case, an adhesive may be provided between the optical member OP and the polarization member PP. Alternatively, the optical member OP may be provided on the polarization member PP by being directly coated and forming a pattern. In the case where the optical member OP is provided on the polarization member PP using a direct coating process, the adhesive may be omitted.

The optical member OP may include a plurality of optical patterns. The optical member bending part OP-B corresponding to the bending area BDA of the display device DD may include a plurality of first optical patterns. The optical member non-bending parts OP-NB1, OP-NB2, generally referred to as the optical member non-bending part OP-NB, corresponding to the non-bending area NBDA of the display device may include a plurality of second optical patterns. The plurality of the optical patterns of the optical member OP will be described hereinafter.

On the optical member OP, the polarization member PP may be disposed. The polarization member PP may include a polarization member bending part PP-B corresponding to the bending area BDA of the display device DD, and polarization member non-bending parts PP-NB1 and PP-NB2 corresponding to the non-bending area NBDA of the display device. The polarization member bending part PP-B and the polarization member non-bending parts PP-NB1 and PP-NB2 may be overlapped with the display panel bending part DP-B and the display panel non-bending parts DP-NB1 and DP-NB2, respectively.

The polarization member PP may be a flexible polarization member. The polarization member PP may have an absorption axis (not shown) extended in one direction. The polarization member PP may absorb lights vibrating in parallel to the absorption axis (not shown) among incident light. For example, the polarization member PP may be a linear polarization layer.

The polarization member PP may be provided as a plurality of film layers. The polarization member PP may include a triacetyl cellulose (TAC) film and a polyvinyl alcohol (PVA) film. For example, the polarization member PP may have a laminated structure of TAC film/PVA film/TAC film. The PVA film plays the role of polarizing light and may be formed by adsorbing a dichromatic dye in polyvinyl alcohol which is a polymer material. The TAC film may support the PVA film. However, an embodiment of the inventive concept is not limited thereto. The polarization member PP may be provided as a shape other than the polarization film formed as the suggested laminated structure. For example, the polarization member PP may be provided as a polarizer formed by directly coating a functional material having polarization function, for example, a coatable polarizer.

In addition, even though not shown in the drawings, the absorption axis of the polarization member PP may be disposed so as to have an included angle with respect to the optical axis of the optical member OP of about 43 to about 47 degrees. For example, the optical axis of the optical member OP may be a slow axis of the $\lambda/4$ retardation layer and may be disposed so that an included angle of the absorption axis of a linear polarization layer and the optical axis of the optical member may be about 45 degrees.

On the optical member PP, the window member WP may be disposed. The window member WP may protect the display panel DP, the optical member OP, and the polarization member PP. The window member WP may be a flexible window. The window member WP may be formed using a glass material or a flexible plastic material. However, an embodiment of the inventive concept is not limited thereto, and a common window member having a shape known in the art may be used, without limitation.

The window member WP may include a window member bending part WP-B disposed corresponding to the bending area BDA of the display device DD, and window member non-bending parts WP-NB1 and WP-NB2 disposed corresponding to the non-bending area NBDA. The window member bending part WP-B may be overlapped with the display panel bending part DP-B, the optical member bending part OP-B, and the polarization member bending part PP-B. In addition, the window member non-bending parts WP-NB1 and WP-NB2 may be overlapped with the display panel non-bending parts DP-NB1 and DP-NB2, the optical member non-bending parts OP-NB1 and OP-NB2, and the polarization member non-bending parts PP-NB1 and PP-NB2.

The window member WP may further include a surface protection layer (not shown). For example, a functional protection layer such as a hard coating layer and a fingerprint preventing layer may be further included on the window member WP.

Even though not shown in the drawings, the flexible display device DD according to an embodiment may further include at least one adhesive (not shown). The adhesive may be disposed between the display panel DP and the optical member OP, or between the optical member OP and the polarization member PP. In addition, the adhesive may be disposed between the display panel DP and the polarization member PP, and may be disposed so as to fill the remaining part excluding the formed part of the optical pattern of the optical member OP. In addition, the adhesive may be disposed between the polarization member PP and the window member WP.

The adhesive may be an optical clear adhesive. The adhesive may be provided as an adhesive sheet and may be provided between the display panel DP and the optical member OP, between the optical member OP and the polarization member PP, or between the polarization member PP and the window member WP. For example, the adhesive may be a pressure sensitive adhesive (PSA). Alternatively, the adhesive may be provided as an optical clear adhesive resin and fixed as an adhesive layer using an additional optical curing or thermal curing process.

In addition, even though not shown in the drawings, a touch sensing unit (not shown) may be further included between the display panel DP and the optical member OP. The touch sensing unit may include a bending part disposed corresponding to the bending area and a non-bending part disposed corresponding to the non-bending area in the display device DD. The flexible display device DD according to an embodiment may improve visibility of the display device DD by disposing the optical member OP and the polarization member PP on the display panel DP and lowering the reflectivity by external light. That is, the external light supplied to the polarization member PP via the window member WP may be transformed into linear polarized light during passing through the polarization member PP which is a linear polarization layer, and may be transformed again into circular polarized light during passing through the optical member OP which is a retardation layer. The light transformed into the circular polarized light is reflected on the surface of the display panel DP and transformed into circular polarized light having a reverse rotational direction. The circular polarized light of which rotational direction is transformed is transformed again into linear polarized light during passing through the optical member OP, and the linear polarized light is transformed into linear polarized light which is perpendicular to a transmission axis of the polarization member PP, thereby blocking the external emission of light. Accordingly, the visibility of the display device DD may be improved by lowering the reflectivity due to external light by disposing a linear polarization layer and a $\lambda/4$ retardation layer on the display panel DP.

Figure 3A:
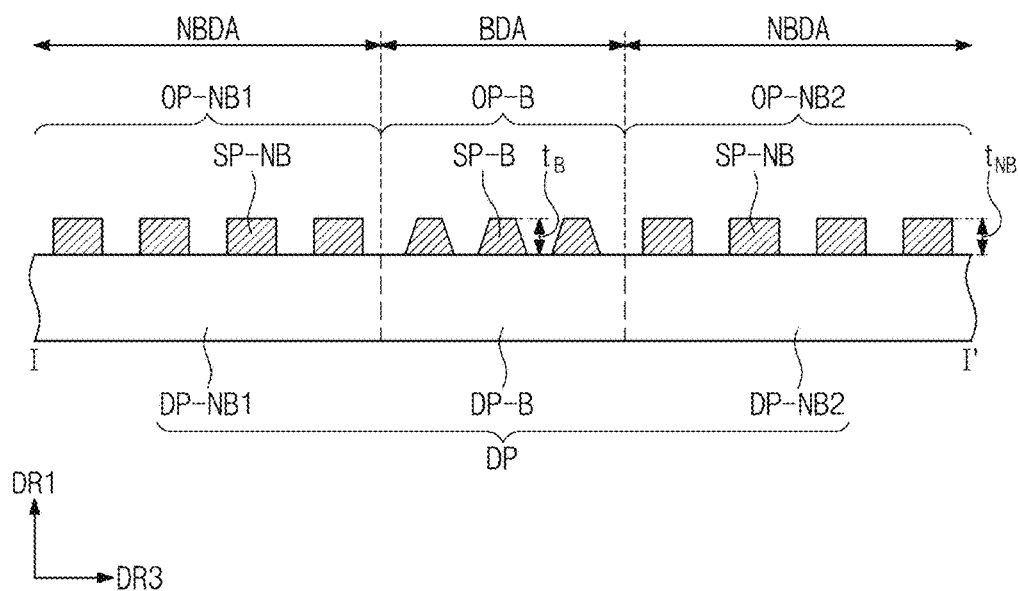
FIGS. 3A and 3B are cross-sectional views of a display panel and an optical member in a flexible display device according to an embodiment.
Figure 3B:
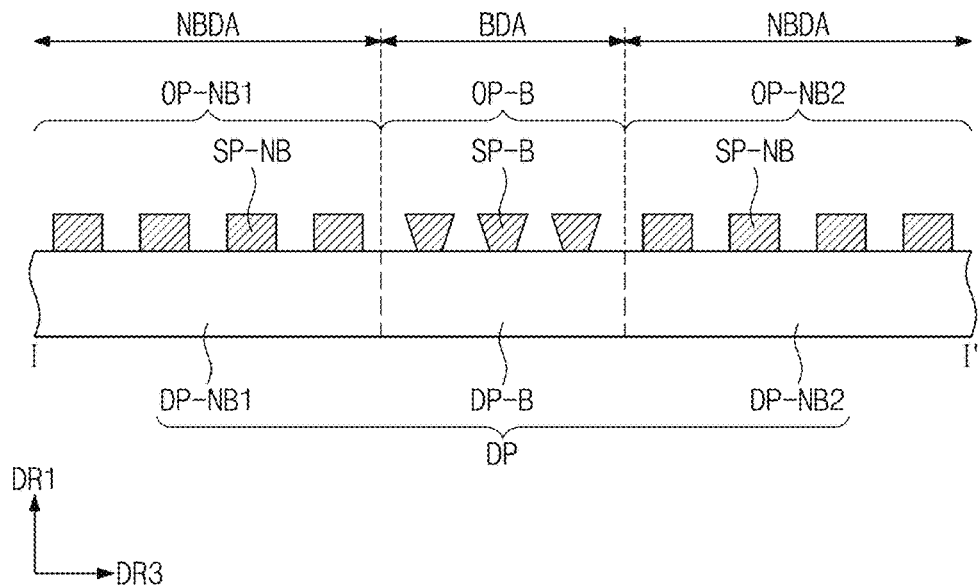

FIGS. 3A to 3B are partial cross-sectional views taken along line I-I' in the flexible display device DD according to an embodiment as shown in FIG. 1. FIGS. 3A to 3B illustrate the cross-sections of the display panel DP and the optical member OP disposed on the display panel DP, which are portions of the flexible display device DD.

The flexible display device DD according to an embodiment may include an optical member OP disposed on the display panel DP, a display panel bending part DP-B and an optical member bending part OP-B may be overlapped, and display panel non-bending parts DP-NB1 and DP-NB2 and optical member non-bending parts OP-NB1 and OP-NB2 may be overlapped. The optical member bending part OP-B corresponding to a bending area BDA includes a plurality of first optical patterns SP-B, and the optical member non-bending parts OP-NB1 and OP-NB2 corresponding to a non-bending area NBDA include a plurality of second optical patterns SP-NB. The cross-sections of the plurality of the second optical patterns SP-NB and the plurality of the first optical patterns SP-B, which are perpendicular to the display panel DP, may be different from each other. In the plurality of the first optical patterns SP-B formed in the optical member bending part OP-B, the width of a first face adjacent to the display panel DP and the width of a second face adjacent to the polarization member PP may be different from each other.

In FIG. 3A, the shape of the cross-section of the first optical pattern SP-B, which is perpendicular to one face of the display panel DP may be a trapezoid. That is, referring to FIG. 3A, the first optical pattern SP-B has a trapezoidal shape of which width increases toward the display panel DP. In addition, the shape of the cross-section of the second optical pattern SP-NB, which is perpendicular to one face of the display panel DP may be a rectangle or a square. In FIG. 3B, the cross-section of the first optical patterns SP-B, which is perpendicular to one face of the display panel DP may be a reverse trapezoid. That is, referring to FIG. 3B, the first optical pattern SP-B has a reverse trapezoidal shape of which width decreases toward the display panel DP. In addition, the shape of the cross-section of the second optical pattern SP-NB, which is perpendicular to one face of the display panel DP may be a rectangle or a square. That is, referring to FIGS. 3A to 3B, the optical member bending part OP-B may include a plurality of first optical patterns SP-B having a cross-section having a trapezoid or reverse trapezoid shape, which is a transformed shape of a rectangle.

In FIGS. 3A to 3B, the thicknesses of the first optical patterns SP-B and the second optical patterns SP-NB are shown the same. However, an embodiment of the inventive concept is not limited thereto. For example, the thickness $t_B$ of the first optical patterns SP-B may be greater than the thickness $t_{NB}$ of the second optical patterns SP-NB.

In the case where the first optical patterns SP-B and the second optical patterns SP-NB are formed using materials having the same birefringence value, the thickness $t_B$ of the first optical patterns SP-B may be greater than the thickness $t_{NB}$ of the second optical patterns SP-NB. For example, in the thickness $t_B$ of the first optical patterns SP-B and the thickness $t_{NB}$ of the second optical patterns SP-NB, $t_B$=1.1× $t_{NB}$. That is, in the case where the flexible display device DD is bent and used with the thickness $t_B$ of the first optical patterns SP-B greater by 1.1 times than the thickness $t_{NB}$ of the second optical patterns SP-NB, the change of a retardation value due to the modification of the shape of the first optical patterns SP-B disposed in the bending area BDA may be compensated.

In addition, in the flexible display device DD according to an embodiment, an optical member bending part OP-B corresponding to a bending area BDA of the display device DD includes optical patterns SP-B having different lengths of a first face and a second face. Accordingly, the change of the retardation value induced by the modification of the shape of an optical member OP may be decreased when bending the display device DD.

In addition, in FIGS. 3A to 3B, the first optical patterns SP-B are shown to have the same shape. However, an embodiment of the inventive concept is not limited thereto. During bending the display device DD, the shape of the first optical pattern SP-B at a portion receiving more tensile force may have a greater side inclination of a trapezoid when compared to a portion receiving relatively smaller tensile force.

Figure 4:
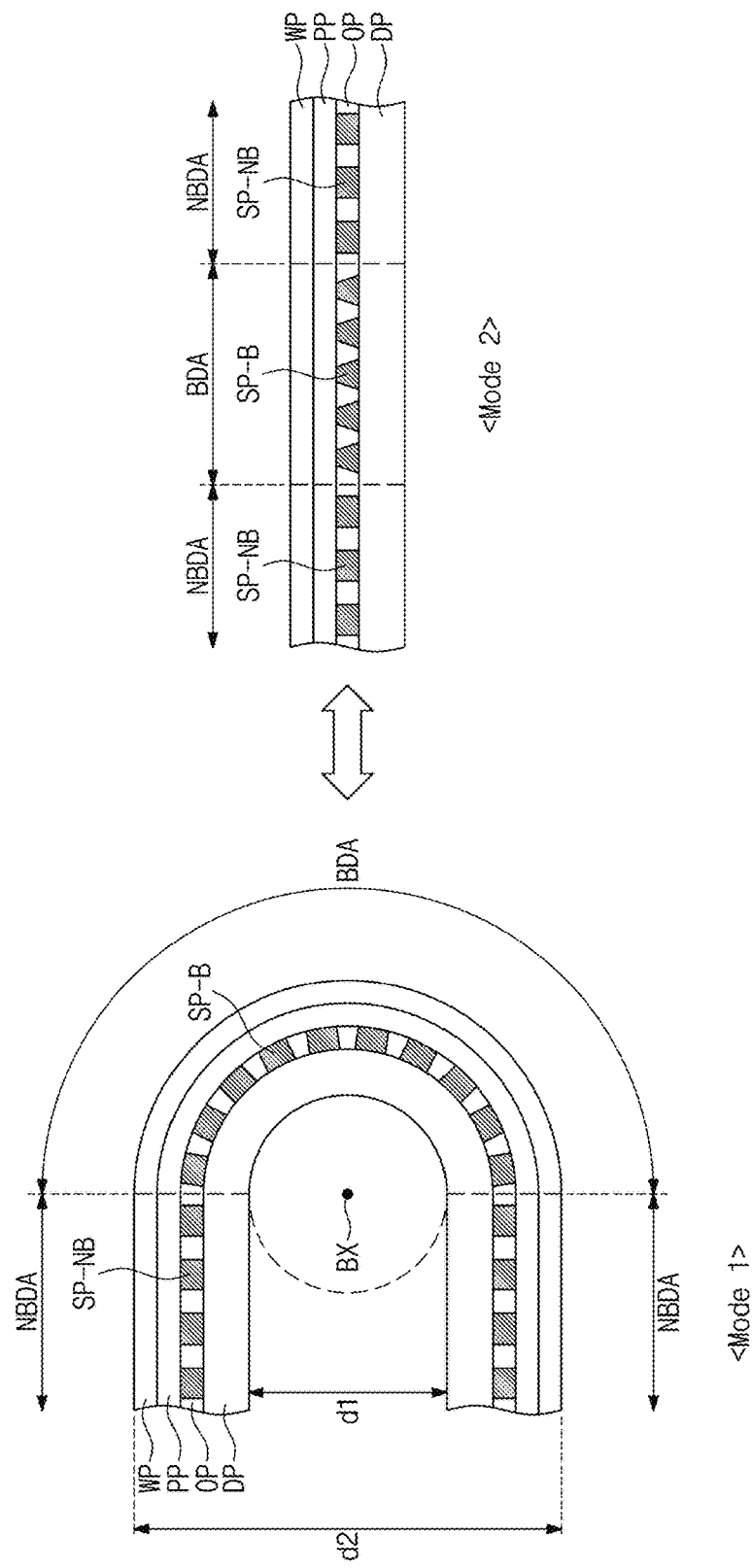
FIG. 4 is a cross-sectional view of a bending state and an unfolded state of a flexible display device according to an embodiment.
Figure 5:
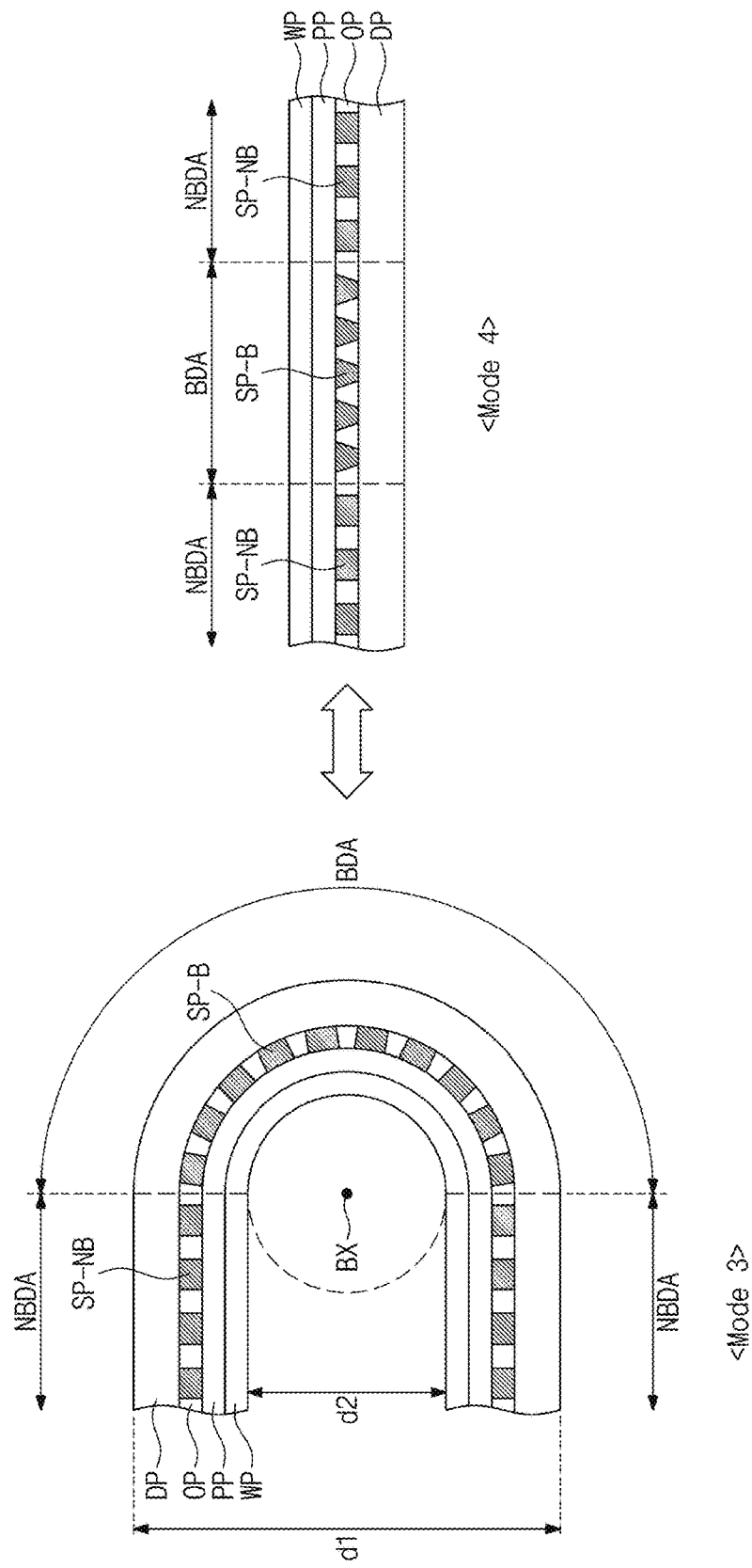
FIG. 5 is a cross-sectional view of a bending state and an unfolded state of a flexible display device according to an embodiment.

FIGS. 4 to 5 are cross-sectional views of portions of flexible display devices according to exemplary embodiments for a bent case and an unfolded case with respect to a bending axis BX. FIG. 4 illustrates a first mode (Mode 1) in which a display panel DP, an optical member OP, a polarization member PP, and a window member WP are bent with respect to a bending axis BX and a second mode (Mode 2) in which the members are unfolded. FIG. 4 corresponds to a case where the optical member OP of FIG. 3A is included. In the first mode (Mode 1), the display panel DP may be disposed closer to the bending axis BX than the window member WP. That is, in the case of the bent first mode (Mode 1), distance d1 between facing display panels DP in the non-bending area NBDA may be shorter than distance d2 between facing window members WP. In FIG. 4, d1 is the minimum distance between facing display panels DP, and d2 is the maximum distance between facing window members WP. That is, the flexible display device in FIG. 4 may be an out-foldable display device which operates so as to expose images on the display panel DP outward.

In each of the plurality of the first optical patterns SP-B in the unfolded second mode (Mode 2) of the flexible display device of FIG. 4, the width of a first face adjacent to the display panel DP may be greater than the width of a second face adjacent to the polarization member PP.

Figure 6A:
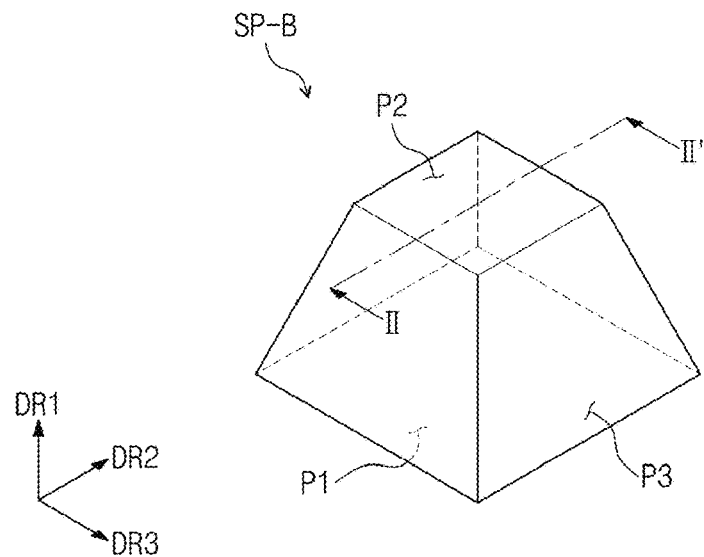
FIGS. 6A and 6B illustrate a first optical pattern of an optical member according to an embodiment.
Figure 6B:
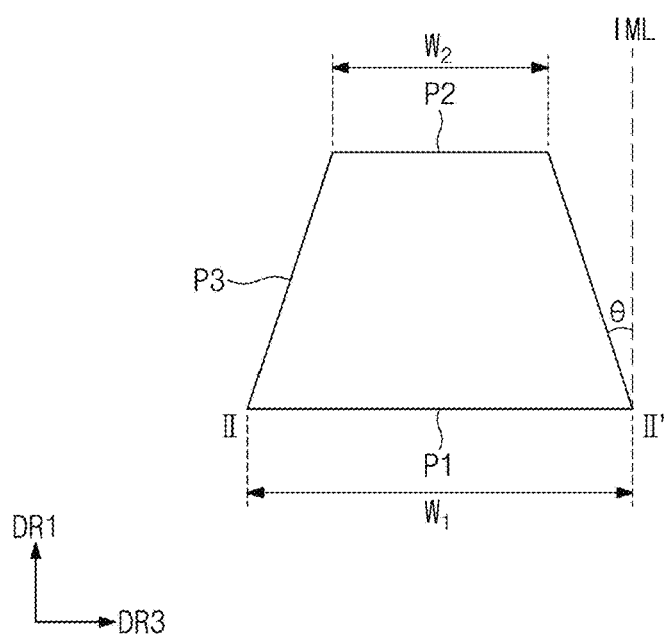

FIGS. 6A to 6B illustrate the shape of the first optical pattern SP-B shown in FIG. 4. FIG. 6A is a schematic diagram of a first optical pattern SP-B, and FIG. 6B is a cross-sectional view of the first optical pattern SP-B taken along line II-IF in FIG. 6A.

The first optical pattern SP-B may include a first face P1, a second face P2 facing to the first face P1, and a side P3 disposed between the first face P1 and the second face P2. Referring to the perspective view of FIG. 6A, the first optical pattern SP-B may have a frustum of quadrangular pyramid of which upper portion is cut. In the case where the first optical pattern SP-B shown in FIGS. 6A to 6B is an embodiment of the first optical pattern SP-B shown in FIG. 4, the first optical pattern SP-B may have a first face P1 adjacent to the display panel DP and having a first width $W_1$ and a second face P2 adjacent to the polarization member PP and having a second width $W_2$. The side P3 may be an inclined face having an inclination with respect to the first face P1. For example, with respect to an imaginary line IML extended in the first direction DR1, the side P3 of the first optical pattern SP-B may have a tilt angle (θ) of about 7 to about 15 degrees with respect to the imaginary line IML. The first optical pattern SP-B having a tilt angle (θ) and a cross-section of a trapezoid with different widths of the first face P1 and second face P2 may have a shape obtained by considering the modification due to tensile force applied to the first face P1 and the second face P2 in the case of using the flexible display device in a bent state.

In the case where the second mode (Mode 2) is modified to the first bent mode (Mode 1) in FIG. 4, a tensile force may be applied to the optical member OP of the bending area BDA. For example, in the first optical patterns SP-B in the optical member bending part OP-B of the optical member OP, the tensile force applied to an adjacent face P2 to the polarization member PP may be greater than that applied to an adjacent face P1 to the display panel DP, and the modification ratio of the second face P2 of the first optical pattern SP-B may increase. Accordingly, in the first mode (Mode 1) which is a bent state, the shape of the cross-section of the first optical patterns SP-B may approach to a rectangle or a square.

In the case where the tilt angle (θ) of the first optical pattern SP-B shown in FIGS. 6A to 6B is less than about 7 degrees, the shape of the first optical pattern SP-B may become similar to a rectangle or a square, and a modified portion of the optical pattern OP during bending the display device DD may be insufficiently reflected. Accordingly, in the case where the tilt angle (θ) is less than about 7 degrees, the increased length of the first face P1 due to the tensile force applied to the first optical pattern SP-B may be relatively greater than the second face P2, thereby inducing optical distortion phenomenon in a bending area BDA. That is, in the first bent mode (Mode 1) of FIG. 4, the shape of the first optical pattern SP-B in the bending area BDA and the shape of the second optical pattern SP-NB in the non-bending area NBDA become different, and light leakage phenomenon or color shift may be generated. In addition, in the case where the tilt angle (θ) is greater than about 15 degrees, the optical properties of the flexible display device DD prior to bending may be deteriorated. That is, in the case where the tilt angle (θ) is greater than about 15 degrees, the light leakage phenomenon according to viewing angle in the unfolded state of the second mode (Mode 2) may become more severe when compared to a case not using the shape of the first optical pattern SP-B.

For example, the light leakage phenomenon described in the disclosure may become an issue when the display panel DP of the display panel DD shown in FIGS. 1 to 2 attains an off state or a black state.

Accordingly, in the flexible display device DD of FIG. 4 according to an embodiment, optical distortion phenomenon due to the modification of the shape of the first optical pattern SP-B of the optical member OP in the bending area BDA may be prevented by disposing the first optical pattern SP-B disposed in the bending area BDA in a trapezoidal shape. Accordingly, light leakage phenomenon in the bending area BDA may be minimized and color shift may be reduced.

Accordingly, in the flexible display device DD of FIG. 4 according to an embodiment, the cross-section of the first optical pattern SP-B has a trapezoidal shape in the second unfolded mode (Mode 2). However, in the bent first mode (Mode 1), the modification of the first face P1 adjacent to the display panel PP is relatively large, the widths of the first face P1 and the second face P2 are similarly modified, and the shape of the cross-section may be transformed to a rectangle or a square, which are similar to the second optical pattern SP-NB in the non-bending part.

FIG. 5 illustrates a bent third mode (Mode 3) of a display panel DP, an optical member OP, a polarization member PP, and a window member WP with respect to a bending axis BX, and an unfolded fourth mode (Mode 4). In the third mode (Mode 3), the window member WP may be disposed closer to the bending axis BX than the display panel DP. That is, in the bent third mode (Mode 3), a distance d1 of facing display panels DP in the non-bending area NBDA may be greater than a distance d2 between facing window members WP. In FIG. 5, d1 is the maximum distance between facing display panels DP, and d2 is the minimum distance between facing window members WP. That is, the flexible display device shown in FIG. 5 may be an in-foldable display device which operates so as not to expose a face providing images outward.

In each of the first optical patterns SP-B in the unfolded fourth mode (Mode 4) of the flexible display device FIG. 5, a first width of a first face adjacent to the display panel DP may be smaller than a second width of the second face adjacent to the polarization member PP. In the case of modifying from the fourth mode (Mode 4) to the bent third mode (Mode 3) in FIG. 5, a tensile force may be applied to the optical member OP in the bending area BDA. For example, in the first optical patterns SP-B of the bending part of the optical member OP, the tensile force applied to a face adjacent to the display panel DP may become greater than the tensile force applied to a face adjacent to the polarization member PP, and the modification ratio of a first face adjacent to the display panel DP of the first optical patterns SP-B may become greater.

Accordingly, in the flexible display device of FIG. 5 according to an embodiment, the cross-section of the first optical patterns SP-B may be a reverse trapezoidal shape in the fourth mode (Mode 4). However, in the bent third mode (Mode 3), the modification of a face adjacent to the display panel DP of the first optical patterns SP-B may become relatively large, the widths of a first face and a second face are similarly modified, and the cross-section may be modified to a rectangle or a square, which is similar to the second optical pattern SP-NB in the non-bending part.

FIGS. 6A to 6B illustrate an embodiment of a first optical pattern SP-B in the bending part of an optical member included in a flexible display device shown in FIG. 4 according to an embodiment. In an embodiment shown in FIG. 5, a first optical pattern having a cross-section with a reverse trapezoidal shape may be included different from FIGS. 6A to 6B.

Figure 7A:
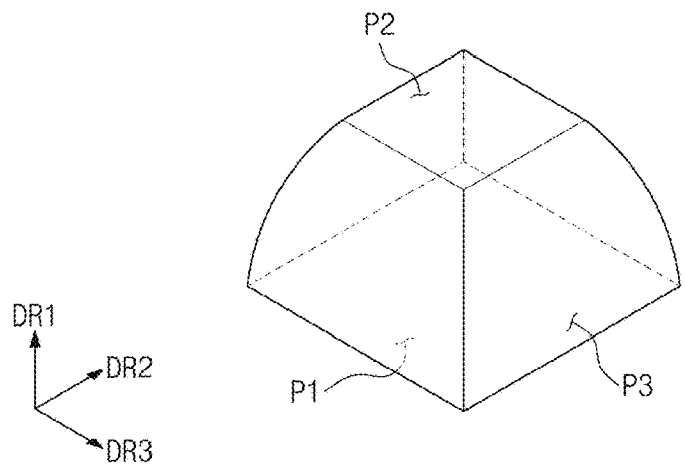
FIGS. 7A, 7B, and 7C are perspective views of a first optical pattern shape of an optical member according to exemplary embodiments.
Figure 7B:
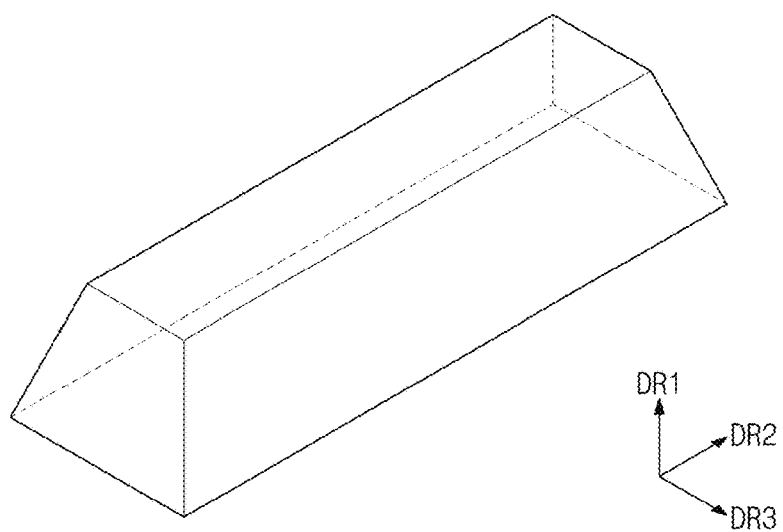
Figure 7C:
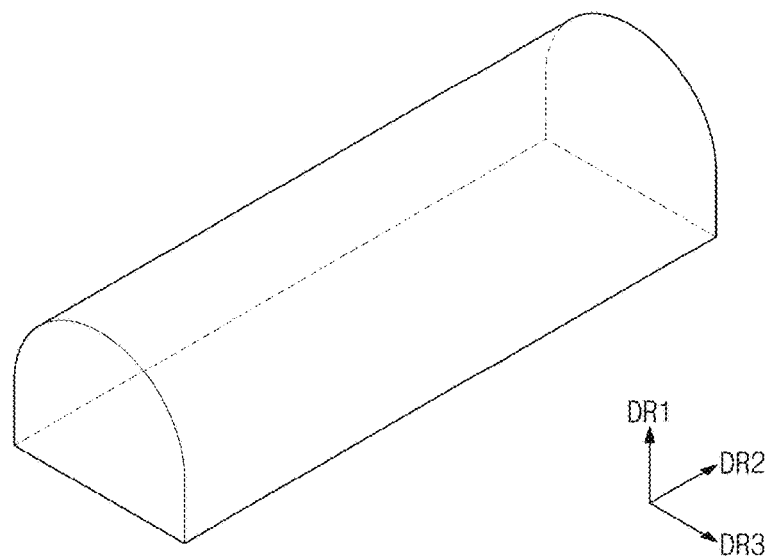

In addition, the shape of the first optical pattern SP-B included in the bending part OP-B of the optical member OP is not limited to the embodiment shown in FIGS. 6A to 6B. FIGS. 7A to 7C are perspective views of various shapes of a first optical pattern SP-B.

FIGS. 7A to 7C illustrate embodiments of a first optical pattern SP-B included in an optical member bending part OP-B of an optical member OP. For example, referring to FIG. 7A, the side P3 may be curved when compared to the first optical pattern shown in FIG. 6A. For example, the first optical pattern shown in FIG. 6A or FIG. 7A according to an embodiment may be disposed corresponding to each pixel of a display panel. For example, the size of the first optical pattern shown in FIG. 6A or 7A may correspond to the size of a pixel of a display panel.

FIG. 7B illustrates a shape of a first optical pattern SP-B which has a cross-section of a trapezoid and has a long stripe shape of which length in a second direction DR2 is greater than the length in a third direction DR3. In addition, FIG. 7C illustrates a shape of a first optical pattern SP-B which has a semi-circular cross-section and has a greater length in a second direction DR2 than a length in a third direction DR3. For example, the first optical patterns in FIGS. 7B to 7C may be disposed in correspondent positions in the bending area of the display device, and may be provided corresponding to one arranged row of a plurality of pixels included in a display panel which will be described later.

Figure 8:
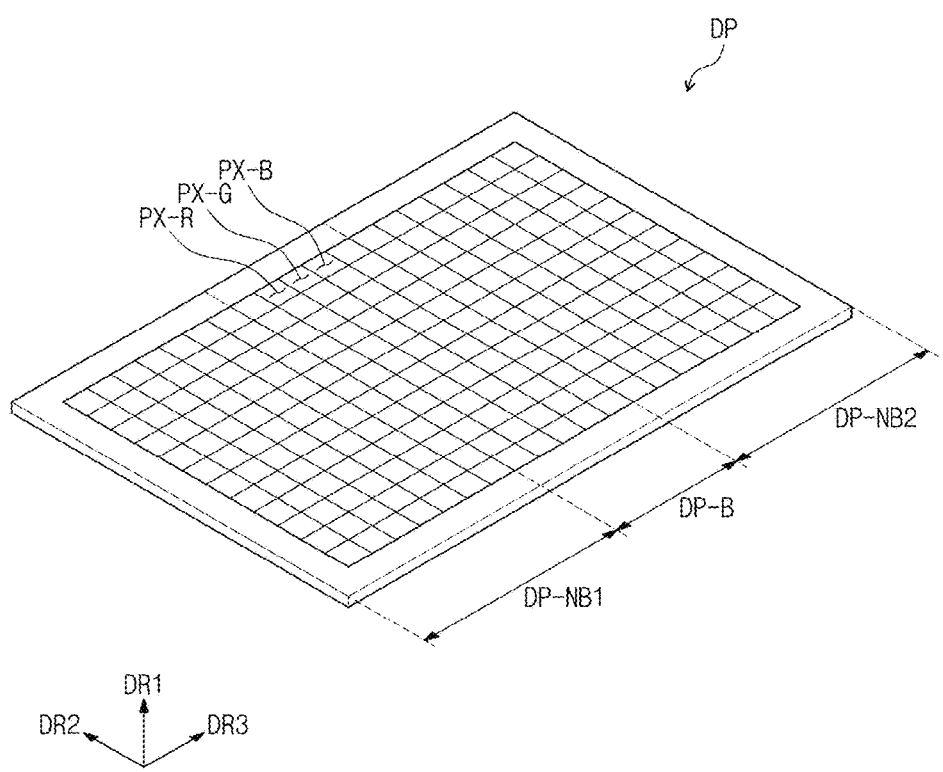
FIG. 8 is a perspective view schematically illustrating a display panel according to an embodiment.
Figure 9:
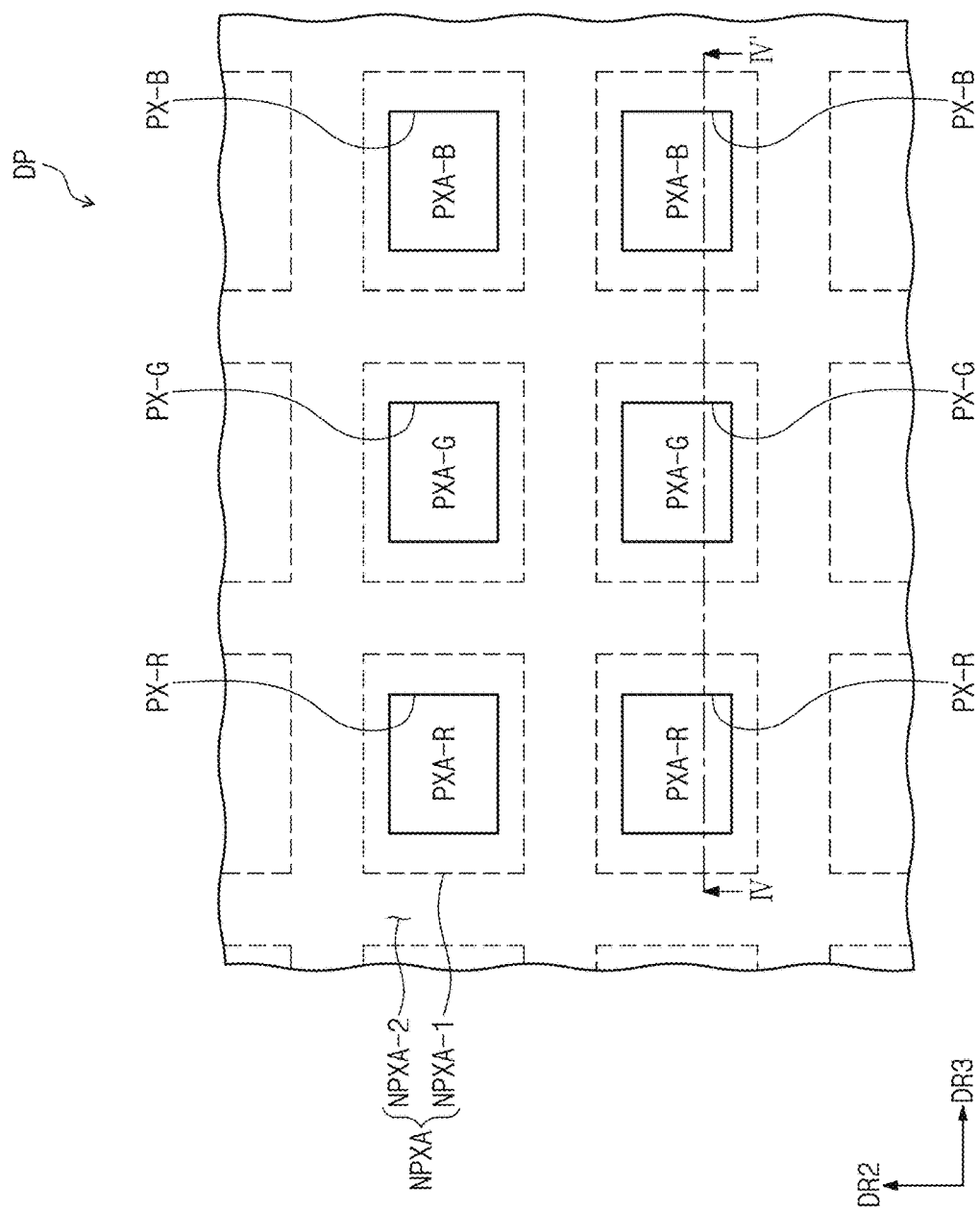
FIG. 9 is a schematic plan view of a display panel according to an embodiment.

FIG. 8 is a perspective view of a display panel DP. FIG. 9 is a plan view of the display panel DP. Hereinafter, the display panel DP is explained by means of an organic light emitting display panel. However, an embodiment of the inventive concept is not limited thereto.

The display panel DP of FIG. 8 includes a display panel bending part DP-B and display panel non-bending parts DP-NB1 and DP-NB2. As shown in FIG. 8, the organic light emitting display panel DP includes a plurality of pixels PX-R, PX-G, and PX-B. In FIG. 8, three kinds of pixels PX-R, PX-G, and PX-B are illustrated, and the three kinds of pixels PX-R, PX-G, and PX-B may generate light with different colors. For example, each of the three kinds of pixels PX-R, PX-G, and PX-B may emit red, green, and blue light, respectively. Each of the three kinds of pixels PX-R, PX-G, and PX-B according to an embodiment of the inventive concept may emit magenta, yellow, and cyan, respectively. The three kinds of pixels PX-R, PX-G, and PX-B may emit light in the first direction DR1 in FIG. 8.

For example, the three kinds of pixels PX-R, PX-G, and PX-B may be arranged in a matrix shape. In addition, each of the three kinds of pixels PX-R, PX-G, and PX-B may be arranged in a row in the second direction DR2. However, an embodiment of the inventive concept is not limited thereto. The arrangement of the plurality of the pixels may be changed diversely according to the accomplishing method of a display panel. In addition, each of the pixels PX-R, PX-G, and PX-B may be defined as sub-pixels generating light with different colors, and the combination of the sub-pixels may be defined as a pixel.

The pixel according to an embodiment of the inventive concept may be a part corresponding to an organic light emitting device according to an embodiment, which will be described later. In addition, each of the three kinds of the pixels PX-R, PX-G, and PX-B may correspond to organic light emitting devices having different light emitting layers, respectively.

As shown in FIG. 9, the display panel DP may be separated into a plurality of emission regions PXA-R, PXA-G, and PXA-B, and a non-emission region NPXA on a plane defined by an axis in the second direction DR2 and an axis in the third direction DR3. In FIG. 9, three kinds of emission regions PXA-R, PXA-G, and PXA-B which are disposed in a matrix type are illustrated. In the three kinds of the emission regions PXA-R, PXA-G, and PXA-B, organic light emitting devices included in the pixels PX-R, PX-G, and PX-B of the display panel DP according to an embodiment as shown in FIG. 8 may be correspondingly disposed.

The non-emission region NPXA may be separated into a first non-emission region NPXA-1 surrounding the three kinds of the emission regions PXA-R, PXA-G, and PXA-B, and a second non-emission region NPXA-2 disposed between the first non-emission regions NPXA-1. For example, the pixel may include an emission region and a non-emission region.

Figure 10:
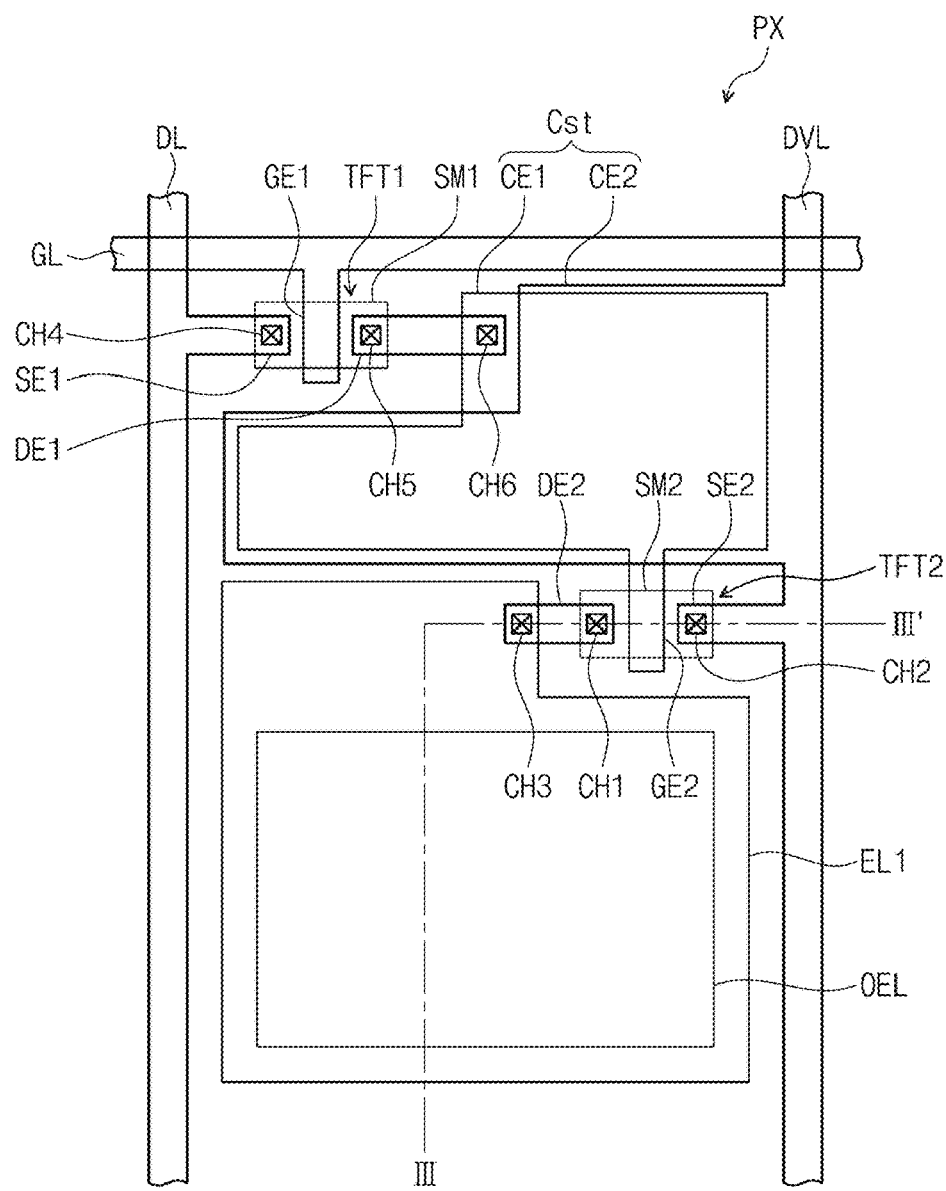
FIG. 10 is a plan view of a pixel among the pixels included in a display device according to an embodiment.
Figure 11:
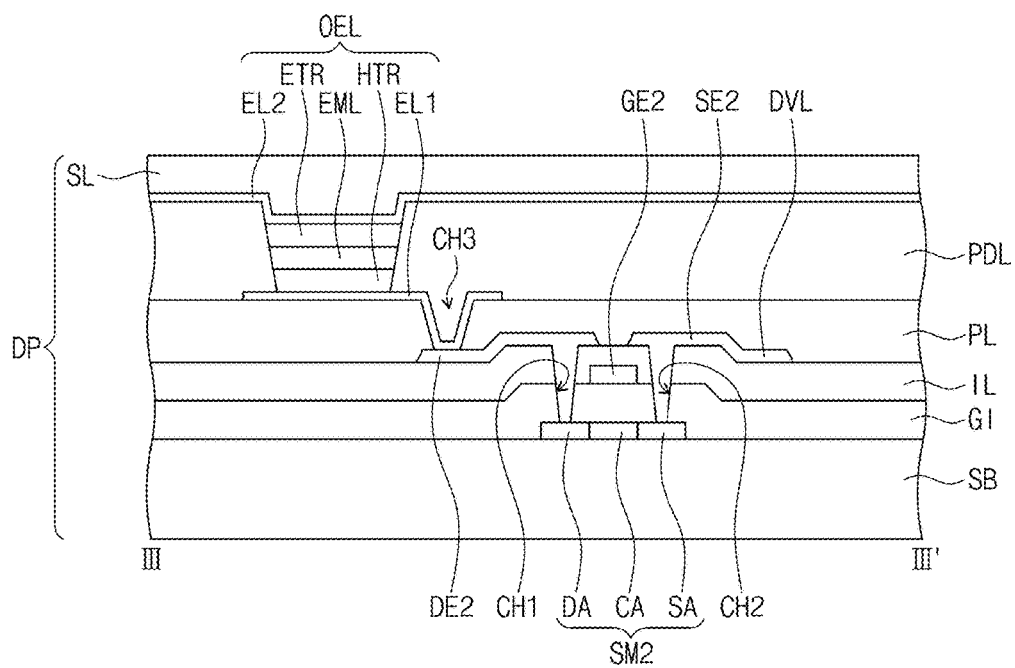
FIG. 11 is a schematic cross-sectional view taken along the line in FIG. 10.

FIG. 10 is a plan view of one among the pixels PX included in a flexible display device according to an embodiment. FIG. 11 is a schematic cross-sectional view taken along the line in FIG. 10;

Each of the pixels PX may be connected with a wiring part including gate lines GL, data lines DL, and driving voltage lines DVL. Each of the pixels PX includes thin film transistors TFT1 and TFT2 connected to the wiring part, an organic light emitting device OEL connected to the thin film transistors TFT1 and TFT2, and a capacitor Cst.

In an embodiment, one pixel PX is connected with one gate line GL, one data line DL, and one driving voltage line DVL for illustration. However, an embodiment of the inventive concept is not limited thereto. A plurality of pixels PX may be connected with one gate line GL, one data line DL, and one driving voltage line DVL. In addition, one pixel PX may be connected with at least one gate line GL, at least one data line DL, and at least one driving voltage wiring DVL, sometimes called a driving voltage line DVL.

The gate lines GL are extended in the third direction DR3. The data lines DL are extended in the second direction DR2 which is crossing the gate line GL. The driving voltage lines DVL are extended in substantially the same direction as the data lines DL, i.e., the second direction DR2. The gate lines GL transmit scanning signals to the thin film transistors TFT1 and TFT2, and the data lines DL transmit data signals to the thin film transistors TFT1 and TFT2, and the driving voltage lines DVL provide a driving voltage to the thin film transistors TFT1 and TFT2.

The thin film transistors TFT1 and TFT2 may include a driving thin film transistor TFT2 for controlling the organic light emitting device OEL and a switching thin film transistor TFT1 for switching the driving thin film transistor TFT2. In an embodiment of the inventive concept, each of the pixels PX includes two thin film transistors TFT1 and TFT2. However, an embodiment of the inventive concept is not limited thereto. Each of the pixels PX may include one thin film transistor and one capacitor, or each of the pixels PX may include at least three thin film transistors and at least two capacitors.

The switching thin film transistor TFT1 includes a first gate electrode GE1, a first source electrode SE1, and a first drain electrode DE1. The first gate electrode GE1 is connected with the gate lines GL, and the first source electrode SE1 is connected with the data lines DL. The first drain electrode DE1 is connected with a first common electrode CE1 via a fifth contact hole CH5. The switching thin film transistor TFT1 transmits data signals applied to the data lines DL to the driving thin film transistor TFT2 according to scanning signals applied to the gate lines GL.

The driving thin film transistor TFT2 includes a second gate electrode GE2, a second source electrode SE2, and a second drain electrode DE2. The second gate electrode GE2 is connected with the first common electrode CE1. The second source electrode SE2 is connected with the driving voltage lines DVL. The second drain electrode DE2 is connected with a first electrode EL1 by a third contact hole CH3.

The first electrode EL1 is connected with the second drain electrode DE2 of the driving thin film transistor TFT2. To a second electrode EL2, a common voltage is applied, and an emission layer EML displays images by emitting blue light according to the output signals of the driving thin film transistor TFT2. The first electrode EL1 and the second electrode EL2 will be described more particularly hereinafter.

The capacitor Cst is connected between the second gate electrode GE2 and the second source electrode SE2 of the driving thin film transistor TFT2 and charges and maintains data signals inputted to the second gate electrode GE2 of the driving thin film transistor TFT2. The capacitor Cst may include the first common electrode CE1 connected with the first drain electrode DE1 via a sixth contact hole CH6 and a second common electrode CE2 connected with the driving voltage line DVL.

Referring to FIG. 11, the display panel DP may include a base substrate SB, the organic light emitting device OEL formed on the base substrate SB, and a sealing layer SL formed on the organic light emitting device OEL.

The base substrate SB may be any substrate commonly used without specific limitation, and the base substrate SB may be a flexible substrate. The base substrate SB may be glass or a plastic substrate using a polymer resin. For example, the base substrate SB may be formed by including polyethylene terephthalate (PET), polyethylene naphthalate (PEN), polyimide, polyethersulfone, etc. The base substrate SB may be selected in consideration of mechanical strength, thermal stability, transparency, surface smoothness, easiness of handling, water-proof properties, etc. The base substrate SB may be transparent.

On the base substrate SB, a substrate buffer layer (not shown) may be provided. The substrate buffer layer (not shown) prevents the diffusion of impurities into the switching thin film transistor TFT1 and the driving thin film transistor TFT2. The substrate buffer layer (not shown) may be formed using silicon nitride (SiNx), silicon oxide (SiOx), silicon oxynitride (SiOxNy), etc., and may be omitted according to the material of the base substrate SB and process conditions.

On the base substrate SB, a first semiconductor pattern SM1 and a second semiconductor pattern SM2 are provided. The first semiconductor pattern SM1 and the second semiconductor pattern SM2 are formed using a semiconductor material and function as an active layer of the switching thin film transistor TFT1 and the driving thin film transistor TFT2, respectively. Each of the first semiconductor pattern SM1 and the second semiconductor pattern SM2 includes a source part SA, a drain part DA and a channel part CA provided between the source part SA and the drain part DA. Each of the first semiconductor pattern SM1 and the second semiconductor pattern SM2 may be formed by selecting an inorganic semiconductor or an organic semiconductor, respectively. The source part SA and the drain part DA may be doped with n-type impurities or p-type impurities.

On the first semiconductor pattern SM1 and the second semiconductor pattern SM2, a gate insulating layer GI is provided. The gate insulating layer GI covers the first semiconductor pattern SM1 and the second semiconductor pattern SM2. The gate insulating layer GI may be formed using an organic insulating material or an inorganic insulating material.

On the gate insulating layer GI, the first gate electrode GE1 and the second gate electrode GE2 are provided. Each of the first gate electrode GE1 and the second gate electrode GE2 is formed to cover a corresponding area in the drain part DA of the first semiconductor pattern SM1 and the second semiconductor pattern SM2.

On the first gate electrode GE1 and the second gate electrode GE2, an insulating interlayer IL is provided. The insulating interlayer IL covers the first gate electrode GE1 and the second gate electrode GE2. The insulating interlayer IL may be formed using an organic insulating material or an inorganic insulating material.

On the insulating interlayer IL, the first source electrode SE1, the first drain electrode DE1, the second source electrode SE2, and the second drain electrode DE2 are provided. The second drain electrode DE2 makes a contact with the drain part DA of the second semiconductor pattern SM2 via a first contact hole CH1 formed in the gate insulating layer GI and the insulating interlayer IL, and the second source electrode SE2 makes a contact with the source part SA of a second semiconductor pattern SM2 via a second contact hole CH2 formed in the gate insulating layer GI and the insulating interlayer IL. The first source electrode SE1 makes a contact with the source part (not shown) of the first semiconductor pattern SM1 via a fourth contact hole CH4 formed in the gate insulating layer GI and the insulating interlayer IL, and the first drain electrode DE1 makes a contact with the drain part (not shown) of the first semiconductor pattern SM1 via a fifth contact hole CH5 formed in the gate insulating layer GI and the insulating interlayer IL.

On the first source electrode SE1, the first drain electrode DE1, the second source electrode SE2, and the second drain electrode DE2, a passivation layer PL is provided. The passivation layer PL may play the role of a protecting layer for protecting the switching thin film transistor TFT1 and the driving thin film transistor TFT2, or the role of a planarization layer for planarizing the top thereof.

On the passivation layer PL, the first electrode EL1 is provided. The first electrode EL1 may be, for example, an anode. The first electrode EL1 is connected to the second drain electrode DE2 of the driving thin film transistor TR2 via the third contact hole CH3 formed in the passivation layer PL.

On the passivation layer PL, a pixel defining layer PDL for separating the emission layer EML so as to correspond to each of the pixels PX is provided. The pixel defining layer PDL exposes the top of the first electrode EL1 and is extruded from the base substrate SB. The pixel defining layer PDL may include a metal fluoride ion compound, without limitation. For example, the pixel defining layer PDL may be formed using one metal fluoride ion compound among LiF, $BaF_2$ and CsF. When the metal fluoride ion compound has a certain thickness, insulating properties may be obtained. The thickness of the pixel defining layer PDL may be, for example, from about 10 nm to about 100 nm.

To each area surrounded by the pixel defining layer PDL, the organic light emitting device OEL is provided. The organic light emitting device OEL includes the first electrode EL1, a hole transport region HTR, the emission layer EML, an electron transport region ETR, and the second electrode EL2.

The first electrode EL1 has conductivity. The first electrode EL1 may be a pixel electrode or an anode. The first electrode EL1 may be formed as a single layer or a plurality of layers. Each of the plurality of layers included in the first electrode EL1 may have a thickness from about 10 nm to about 150 nm. The first electrode EL1 may be formed as a transmission type electrode, a transflective type electrode or a reflection type electrode. When the first electrode EL1 is formed as the transmission type electrode, the first electrode EL1 may be formed using a transparent metal oxide, for example, indium tin oxide (ITO), indium zinc oxide (IZO), zinc oxide (ZnO), indium tin zinc oxide (ITZO), etc. When the first electrode EL1 is formed as the transflective type electrode or the reflection type electrode, the first electrode EL1 may include at least one of Al, Cu, Ti, Mo, Ag, Mg, Pt, Pd, Au, Ni, Nd, Ir, or Cr.

On the first electrode EL1, an organic layer may be disposed. The organic layer includes the emission layer EML. The organic layer may further include the hole transport region HTR and the electron transport region ETR. The hole transport region HTR may be provided on the first electrode EL1. The hole transport region HTR may include at least one of a hole injection layer HIL, a hole transport layer, a buffer layer and an electron blocking layer.

The hole transport region HTR may have a single layer formed using a single material, a single layer formed using a plurality of different materials or a multilayered structure including a plurality of layers formed using a plurality of different materials. For example, the hole transport region HTR may have the structure of a single layer formed using a plurality of different materials, or a laminated structure from the first electrode EL1 of hole injection layer/hole transport layer, hole injection layer/hole transport layer/buffer layer, hole injection layer/buffer layer, hole transport layer/buffer layer, or hole injection layer/hole transport layer/electron blocking layer, without limitation.

The hole transport region HTR may be formed using various methods such as a vacuum evaporation method, a spin coating method, a cast method, a Langmuir-Blodgett (LB) method, an inkjet printing method, a laser printing method, a laser induced thermal imaging (LITI) method, etc.

When the hole transport region HTR includes the hole injection layer, the hole transport region HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris {N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), etc., without limitation.

When the hole transport region HTR includes the hole transport layer, the hole transport region HTR may include carbazole derivatives such as N-phenylcarbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris (N-carbazolyl)triphenylamine (TCTA), N,N'-di(1-naphthyl)-N,N'-diphenylbenzidine (NPB), 4,4'-cyclohexylidene bis[N,N-bis(4-methylphenyl)benzeneamine] (TAPC), etc., without limitation.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, a metal oxide and a cyano group-containing compound, without limitation. For example, non-limiting examples of the p-dopant may include quinone derivatives such as tetracyanoquinodimethane (TCNQ), and 2,3,5,6-tetrafluoro-tetracyanoquinodimethane (F4-TCNQ), a metal oxide such as tungsten oxide, and molybdenum oxide, without limitation.

The emission layer EML is provided on the hole transport region HTR. The emission layer EML may have a single layer formed using a single material, a single layer formed using a plurality of different materials, or a multilayered structure including a plurality of layers formed using a plurality of different materials.

The emission layer EML may be formed using any commonly used material without specific limitation, and for example, may be formed using a material emitting red, green or blue light and may include a phosphorescent material or a fluorescent material. In addition, the emission layer EML may include a host or a dopant.

The host may be any material commonly used without specific limitation and include e.g., tris(8-hydroxyquinolino) aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tri(1-phenyl-1H-benzo[d]imidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), etc.

When the emission layer EML emits red light, the emission layer EML may further include a phosphorescent material including, for example, tris(dibenzoylmethanato) phenanthoroline europium (PBD:Eu(DBM)3(Phen)) or perylene. When the emission layer EML emits red light, the dopant included in the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac), tris(1-phenylquinoline)iridium (PQIr) and octaethylporphyrin platinum (PtOEP).

When the emission layer EML emits green light, the emission layer EML may include a phosphorescent material including, for example, tris(8-hydroxyquinolino)aluminum (Alq3). When the emission layer EML emits green light, the dopant included in the emission layer EML may be selected from a metal complex or an organometallic complex such as fac-tris(2-phenylpyridine)iridium (Ir(ppy)3).

When the emission layer EML emits blue light, the emission layer EML may include a phosphorescent material including at least one selected from the group consisting of, for example, spiro-DPVBi (DPVBi), spiro-6P, distyryl-benzene (DSB), distyryl-arylene (DSA), a polyfluorene (PFO)-based polymer and a poly(p-phenylene vinylene) (PPV)-based polymer. When the emission layer EML emits blue light, the dopant included in the emission layer EML may be selected from a metal complex or an organometallic complex such as $(4,6-F2ppy)_2Irpic$. The emission layer EML will be described in detail hereinafter.

The electron transport region ETR may be provided on the emission layer EML. The electron transport region may include at least one of a hole blocking layer, an electron transport layer, and an electron injection layer. However, an embodiment of the inventive concept is not limited thereto.

In the case where the electron transport region includes an electron transport layer, the electron transport region may include tris(8-hydroxyquinolino)aluminum (Alq3), 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,5-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof, without limitation. The thickness of the electron transport layers may be from about 100 Å to about 1000 Å, and for example, from about 150 Å to about 500 Å. In the case where the thickness of the electron transport layers satisfy the above-described range, satisfactory electron transport properties may be obtained without substantial increase of a driving voltage.

When the electron transport region includes the electron injection layer, the electron transport region may use LiF, lithium quinolate (LiQ), $Li_2O$, BaO, NaCl, CsF, a metal in lanthanoides such as Yb, or a metal halide such as RbCl and RbI, without limitation. The electron injection layer also may be formed using a mixture material of the hole transport material and an insulating organo metal salt. The organo metal salt may be a material having an energy band gap of greater than or equal to about 4 eV. Particularly, the organo metal salt may include, for example, a metal acetate, a metal benzoate, a metal acetoacetate, a metal acetylacetonate or a metal stearate. The thickness of the electron injection layer may be from about 1 Å to about 100 Å, and from about 3 Å to about 90 Å. When the thickness of the electron injection layer satisfies the above described range, satisfactory electron injection properties may be obtained without inducing the substantial increase of a driving voltage.

The electron transport region ETR may include a hole blocking layer, as described above. The hole blocking layer may include at least one of, for example, BCP and Bphen, without limitation.

The second electrode EL2 is provided on the electron transport region ETR. The second electrode EL2 may be a common electrode or a cathode. The second electrode EL2 may have a grain size of about 10 nm to about 100 nm. The second electrode EL2 may include a plurality of layers having a grain size of about 10 nm to about 100 nm. The plurality of the layers included in the second electrode EL2 may have a thickness from about 10 nm to about 150 nm.

The second electrode EL2 may be a transmission type electrode, transflective type electrode or reflection type electrode. When the second electrode EL2 is the transmission type electrode, the second electrode EL2 may include Li, Ca, LiF/Ca, LiF/Al, Al, Mg, BaF, Ba, Ag, a compound thereof or a mixture thereof (for example, a mixture of Ag and Mg).

The second electrode EL2 may include an auxiliary electrode. The auxiliary electrode may include a layer formed by depositing the above-described material toward an emission layer, a transparent metal oxide on the layer, for example, ITO, IZO, ZnO, ITZO, Mo and Ti, etc.

When the second electrode EL2 is the transflective type electrode or the reflection type electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof or a mixture thereof (for example, a mixture of Ag and Mg). The second electrode EL2 may be a reflective layer or a transflective layer formed using the above material and a multilayered structure including a transparent conductive layer formed using ITO, IZO, ZnO, ITZO, etc.

When the organic light emitting device OEL is a front luminescent type, the first electrode EL1 may be the reflection type electrode, and the second electrode EL2 may be the transmission type electrode or the transflective type electrode. When the organic light emitting device OEL is a backside luminescent type, the first electrode EL1 may be the transmission type electrode or the transflective type electrode, and the second electrode EL2 is the reflection type electrode.

In the organic light emitting device OEL, according to the application of voltages to the first electrode EL1 and the second electrode EL2, respectively, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light is emitted by the transition of the excitons from an excited state to a ground state.

On the second electrode EL2, the sealing layer SL is provided. The sealing layer SL covers the second electrode EL2. The sealing layer SL may include at least one layer among an organic layer and an inorganic layer. The sealing layer SL may be, for example a thin film sealing layer. The sealing layer SL protects the organic light emitting device OEL. On one side of the sealing layer SL, a black printed layer (not shown) may be partially disposed. For example, on one side of the sealing layer SL adjacent to the second electrode EL2, a black printed layer (not shown) may be disposed, and the black printed layer may be correspondingly disposed on the pixel defining layer PDL. However, an embodiment of the inventive concept is not limited thereto. The black printed layer may be printed and disposed on one exposed side of the sealing layer SL. The black printed layer is mainly disposed in a region where the organic light emitting device OEL is not disposed. Referring to the plan view of FIG. 9, the black printed layer may be disposed corresponding to a non-emitting area NPXA, also called the non-emission region NPXA.

Figure 12:
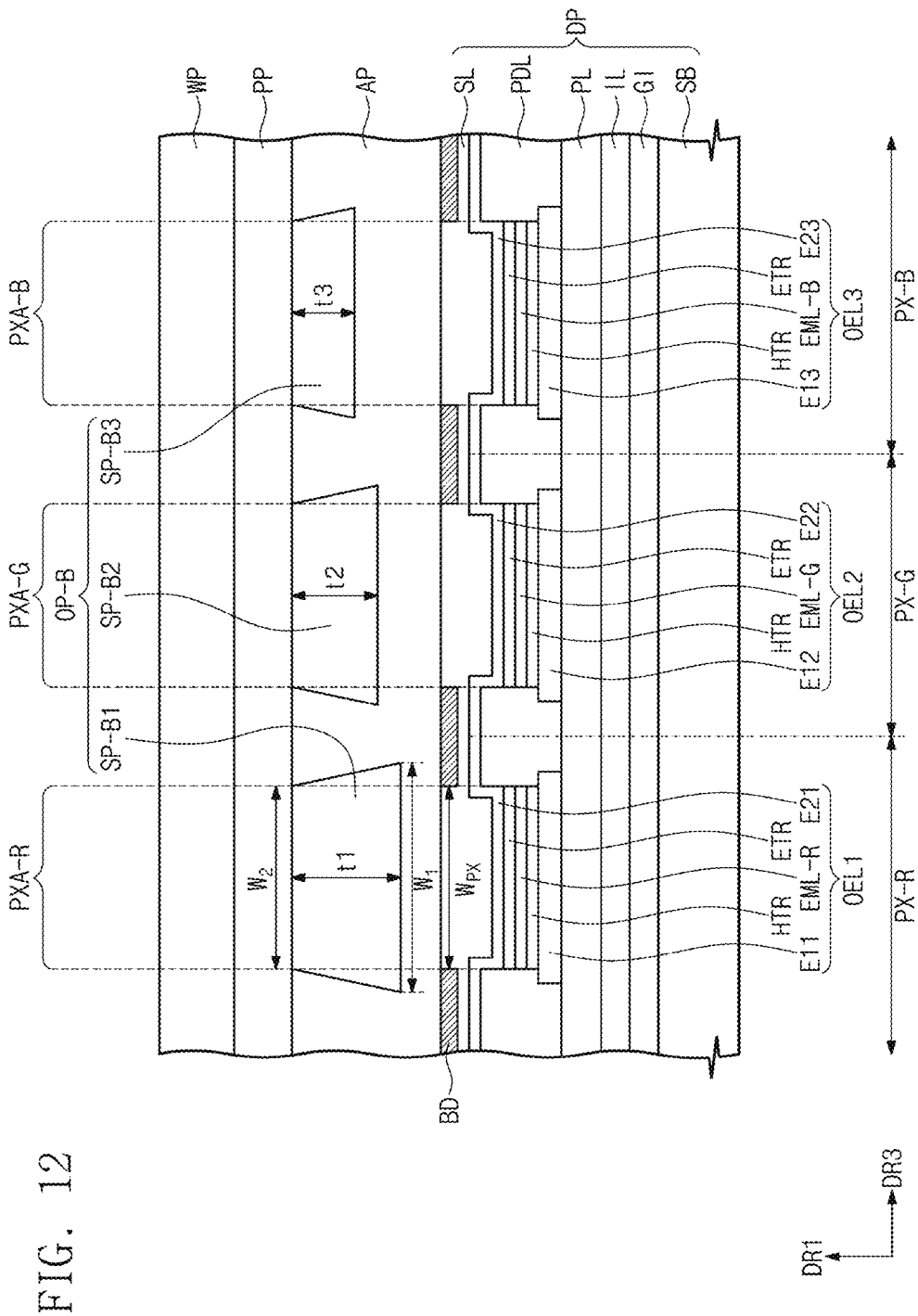
FIG. 12 is a cross-sectional view in a bending area of a flexible display device according to an embodiment.
Figure 13:
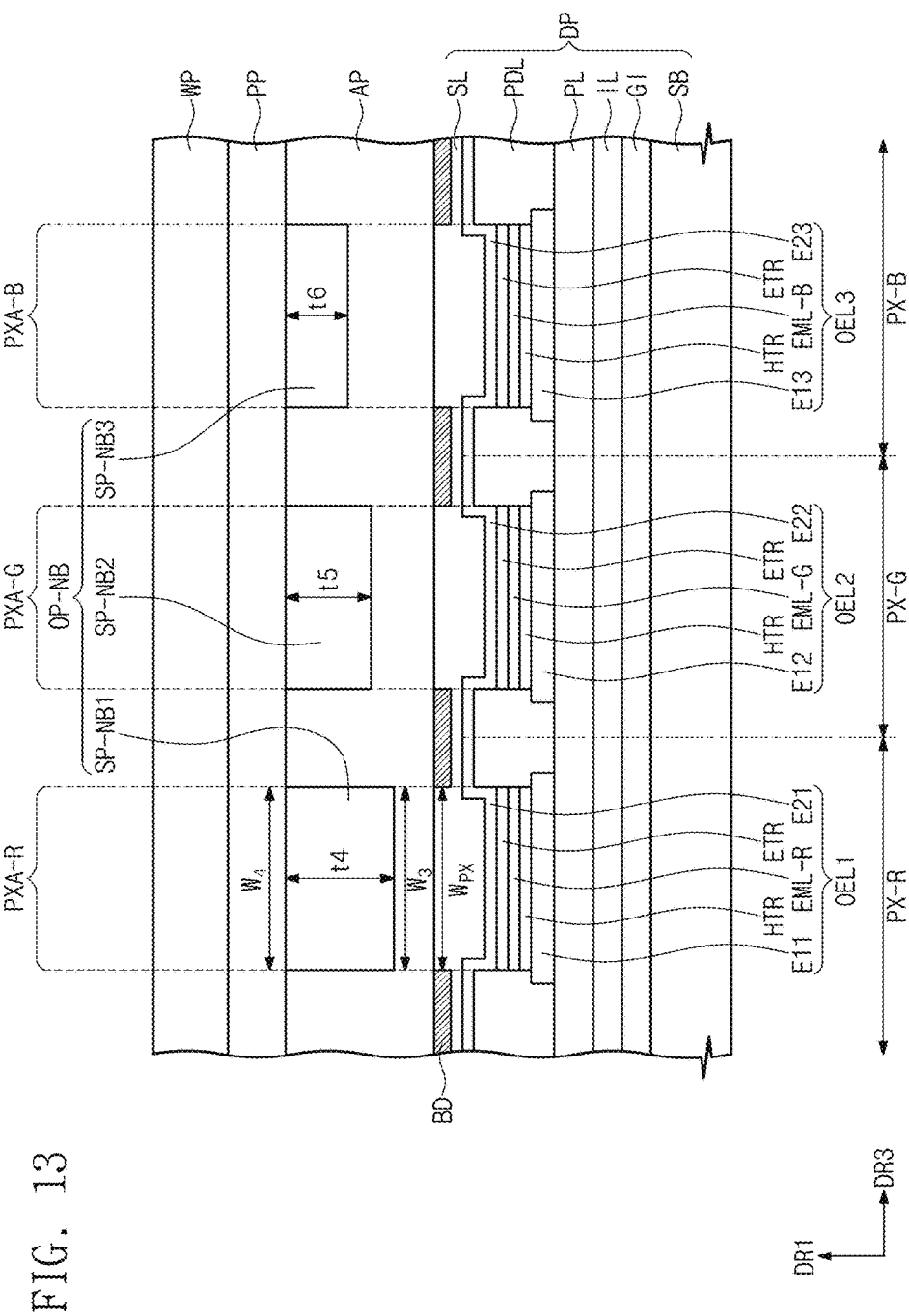
FIG. 13 is a cross-sectional view in a non-bending area of a flexible display device according to an embodiment.

FIGS. 12 to 13 are cross-sectional views of a flexible display device according to an embodiment. FIG. 12 is a cross-sectional view in a bending area of a flexible display device according to an embodiment, and FIG. 13 is a cross-sectional view in a non-bending area of a flexible display device according to an embodiment. Referring to FIGS. 12 to 13, the flexible display device according to an embodiment may include a display panel DP, an optical member OP, a polarization member PP, a window member WP, and an adhesive AP disposed between the polarization member PP and the display panel DP and disposed while filling an undisposed part by the optical member OP. In an embodiment of FIGS. 12 to 13, the optical patterns of the optical member OP may be disposed adjacent to the polarization member PP. However, an embodiment of the inventive concept is not limited thereto. The optical patterns may be disposed adjacent to the display panel DP. In addition, the adhesive AP may be disposed at both sides of the optical patterns of the optical member OP.

The display panel DP includes a base substrate SB, a gate insulating layer GI, an insulating interlayer IL, a passivation layer PL, a pixel defining layer PDL, organic light emitting devices OEL1, OEL2, and OEL3, and a sealing layer SL. In addition, the sealing layer SL includes a black printed layer BD. The black printed layer BD may be disposed via overlap at a position corresponding to the pixel defining layer PDL. The black printed layer BD may be disposed between pixels PX-R, PX-G, and PX-B and emission regions PXA-R, PXA-G, and PXA-B. The black printed layer BD may separate the emission regions PXA-R, PXA-G, and PXA-B from each other. The black printed layer BD may prevent the reflection due to external light.

In FIG. 12, in the bending area of the flexible display device according to an embodiment, a plurality of first optical patterns SP-B1, SP-B2, and SP-B3 may be disposed in one-to-one correspondence with a plurality of pixels PX-R, PX-G, and PX-B. In FIG. 13, in the non-bending area of the flexible display device according to an embodiment, a plurality of second optical patterns SP-NB1, SP-NB2, and SP-NB3 may be disposed in one-to-one correspondence with a plurality of pixels PX-R, PX-G, and PX-B.

The plurality of the pixels may include a first pixel PX-R exhibiting first color, a second pixel PX-G exhibiting second color, and a third pixel PX-B exhibiting third color. The first, second and third pixels may include the organic light emitting devices OEL1, OEL2, and OEL3 separated by the pixel defining layer PDL. In addition, each of the organic light emitting devices separated by the pixel defining layer PDL may have an emission layer emitting light having different wavelengths. In addition, the plurality of the pixels PX-R, PX-G, and PX-B may have emission regions PXA-R, PXA-G, and PXA-B corresponding to each of the organic light emitting devices OEL1, OEL2, and OEL3.

For example, the first organic light emitting device OEL1 includes a first electrode E11, a hole transport region HTR, a red emitting layer EML-R, an electron transport region ETR, and a second electrode E21. The second organic light emitting device OEL2 includes a first electrode E12, a hole transport region HTR, a green emitting layer EML-G, an electron transport region ETR, and a second electrode E22. In addition, the third organic light emitting device OEL3 includes a first electrode E13, a hole transport region HTR, a blue emitting layer EML-B, an electron transport region ETR, and a second electrode E23. Accordingly, each of the pixels PX-R, PX-G, and PX-B may emit a specific color, for example, one of red light, green light, and blue light. However, the kind of the color light is not limited thereto, and for example, white light, cyan light, magenta light, yellow light, etc. may be added.

In FIG. 12, the first sub optical pattern SP-B1 is disposed corresponding to the first pixel PX-R, the second sub optical pattern SP-B2 is disposed corresponding to the second pixel PX-G, and the third sub optical pattern SP-B3 is disposed corresponding to the third pixel PX-B. The first, second and third sub optical patterns SP-B1, SP-B2, and SP-B3 may have a width $W_1$ of a face adjacent to the display panel DP different from a width $W_2$ of a face adjacent to the polarization member PP. FIG. 12 is an embodiment of an outfoldable display device which is operated as in FIG. 4, where $W_1 > W_2$. However, an embodiment of the inventive concept is not limited thereto. In consideration of an operation mode of a flexible display device, the sub optical patterns may be formed so as to satisfy $W_1 < W_2$.

In an embodiment of FIG. 12, the width $W_2$ of a face adjacent to the polarization member PP may be equal to or greater than the width $W_{PX}$ of the emission region of the pixel. By forming the minimum width $W_2$ of the sub optical pattern equal to or greater than the width $W_{PX}$ of the emission region, an alignment error when aligning and disposing the sub optical patterns in the emission region may be minimized.

The heights of the first sub optical pattern SP-B1, the second sub optical pattern SP-B2, and the third sub optical pattern SP-B3 may be different from each other. In the case where the first, second, and third colors are red, green, and blue, respectively, the heights of the first, second, and third sub optical patterns SP-B1, SP-B2, and SP-B3 may have the following relationship.

$$t1 > t2 > t3$$

where t1, t2 and t3 correspond to the height of the first, second, and third sub optical patterns SP-B1, SP-B2, and SP-B3, respectively.

That is, in the case where the first, second, and third sub optical patterns SP-B1, SP-B2, and SP-B3 are formed using materials having the same birefringence value, a retardation value corresponding to each pixel may be obtained by controlling the thickness of the sub optical patterns.

In FIG. 13, a fourth sub optical pattern SP-NB1 is disposed corresponding to the first pixel PX-R, a fifth sub optical pattern SP-NB2 is disposed corresponding to the second pixel PX-G, and a sixth sub optical pattern SP-NB3 is disposed corresponding to the third pixel PX-B. The fourth, fifth and sixth optical patterns SP-NB1, SP-NB2, and SP-NB3 may have the same width $W_3$ of a face adjacent to the display panel DP as a width $W_4$ of a face adjacent to the polarization member PP. The widths $W_3$, $W_4$ of the fourth, fifth and sixth optical patterns SP-NB1, SP-NB2, and SP-NB3 may be equal to or greater than the width $W_{PX}$ of the emission region of the pixel. By forming the minimum width $W_3$, $W_4$ of the sub optical pattern equal to or greater than the width $W_{PX}$ of the emission region, an alignment error when aligning and disposing the sub optical patterns in the emission region may be minimized.

The heights of the fourth sub optical pattern SP-NB1, the fifth sub optical pattern SP-NB2, and the sixth sub optical pattern SP-NB3 may be different from each other. In the case where the first, second, and third colors are red, green, and blue, respectively, the heights of the fourth, fifth, and sixth sub optical patterns may have the following relationship.

$$t4 > t5 > t6$$

where t4, t5 and t6 correspond to the height of the fourth, fifth, and sixth sub optical patterns SP-NB1, SP-NB2, and SP-NB3, respectively.

That is, in the case where the fourth, fifth, and sixth sub optical patterns SP-NB1, SP-NB2, and SP-NB3 are formed using materials having the same birefringence value, a retardation value corresponding to each pixel may be obtained by controlling the thickness of the sub optical patterns.

Meanwhile, for the retardation value of the sub optical patterns disposed in the pixels exhibiting the same color, the retardation value of the sub optical patterns disposed in the bending area may be greater than the retardation value of the sub optical patterns disposed in the non-bending area. That is, in the case where the main wavelength of light emitted from each pixel is λ, and the phase difference value of the sub optical patterns in the non-bending area is λ/4, the phase difference value of each sub optical pattern may be controlled so that the phase difference value of the sub optical patterns in the bending area has a greater retardation value than the retardation value corresponding to λ/4.

For example, a first sub optical pattern SP-B1 may be disposed in the bending area of FIG. 12, and a fourth sub optical pattern SP-NB1 may be disposed in the non-bending area of FIG. 13 corresponding to the first pixel PX-R which exhibits red. In the case where the main wavelength of the first pixel PX-R exhibiting red is about 650 nm, and the fourth optical pattern SP-NB1 is formed to have a retardation value of about 163 nm, the first sub optical pattern SP-B1 may be formed so as to have a retardation value of about 178 nm. However, the suggested retardation value is only an illustration, and the retardation value is not limited thereto. That is, the retardation value of the fourth sub optical pattern SP-NB1 is determined on the basis of λ/4 in consideration of the main wavelength of the displaying light of the first pixel. On the contrary, the retardation value of the first sub optical pattern SP-B1 disposed in the bending area may be formed as a value greater than the retardation value of the fourth sub optical pattern SP-NB1 in consideration of the modification ratio of the sub optical pattern during bending a display device. For example, the retardation value of the first sub optical pattern SP-B1 may be an increased value by about 10% of the retardation value of the fourth sub optical pattern SP-NB1.

The same applied to the second pixel PX-G exhibiting green and the third pixel PX-B exhibiting blue. For example, in the case where the main wavelength of the second pixel PX-G is about 550 nm, the fifth sub optical pattern SP-NB2 may have a retardation value of about 138 nm, and the second sub optical pattern SP-B2 may have a retardation value of about 151 nm. In the case where the main wavelength of the third pixel PX-B is about 450 nm, the sixth sub optical pattern SP-NB3 may be formed to have a retardation value of about 113 nm, and the third sub optical pattern SP-B3 may be formed to have a retardation value of about 123 nm.

The retardation values are only illustration, and the retardation value may have an error range from the illustrated values. In addition, the retardation value may be changed according to the wavelength of light emitted from each pixel.

Figure 15:
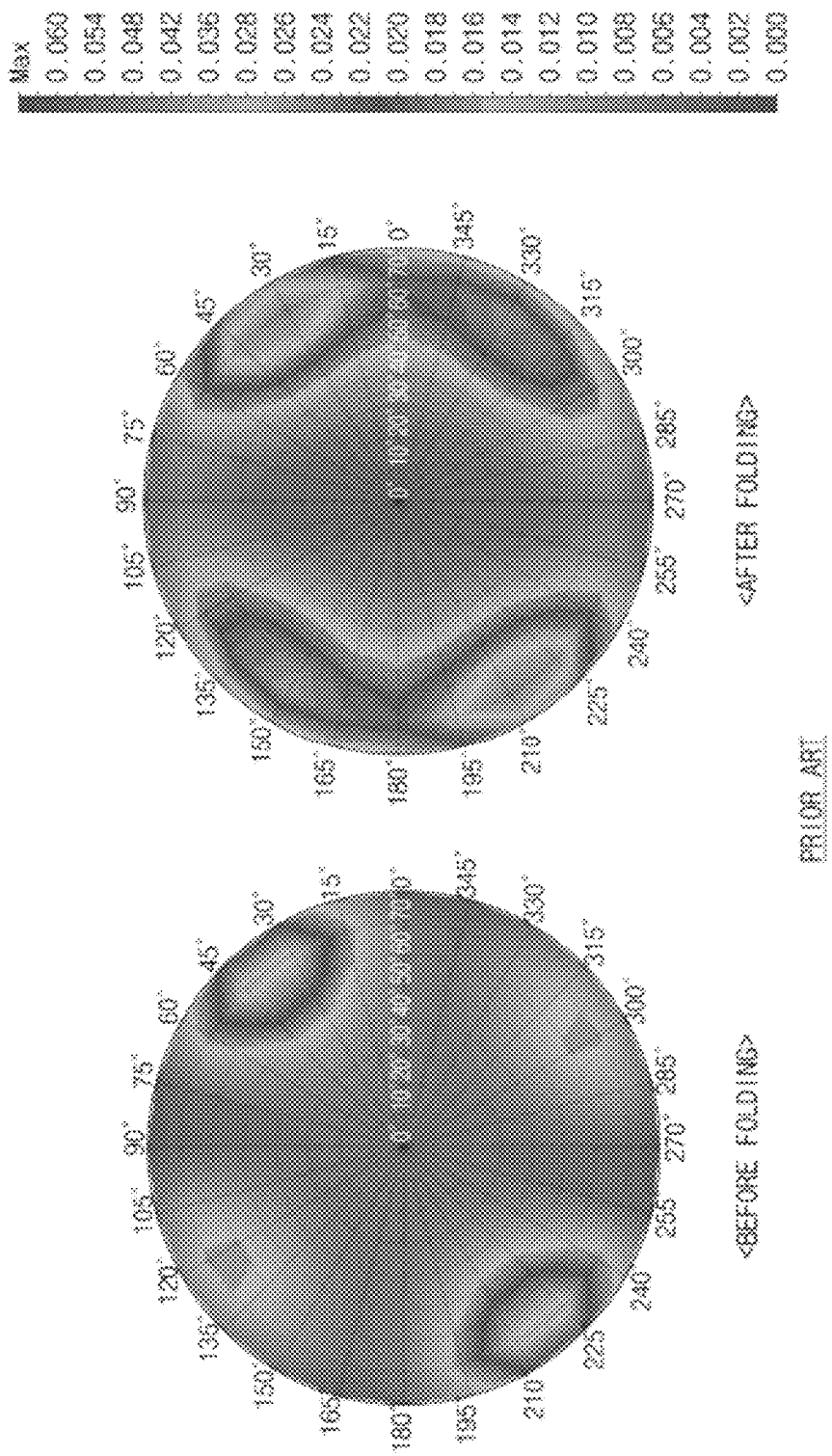
FIG. 15 is a contour plot illustrating luminance value in accordance with viewing angle in a common flexible display device.
Figure 16:
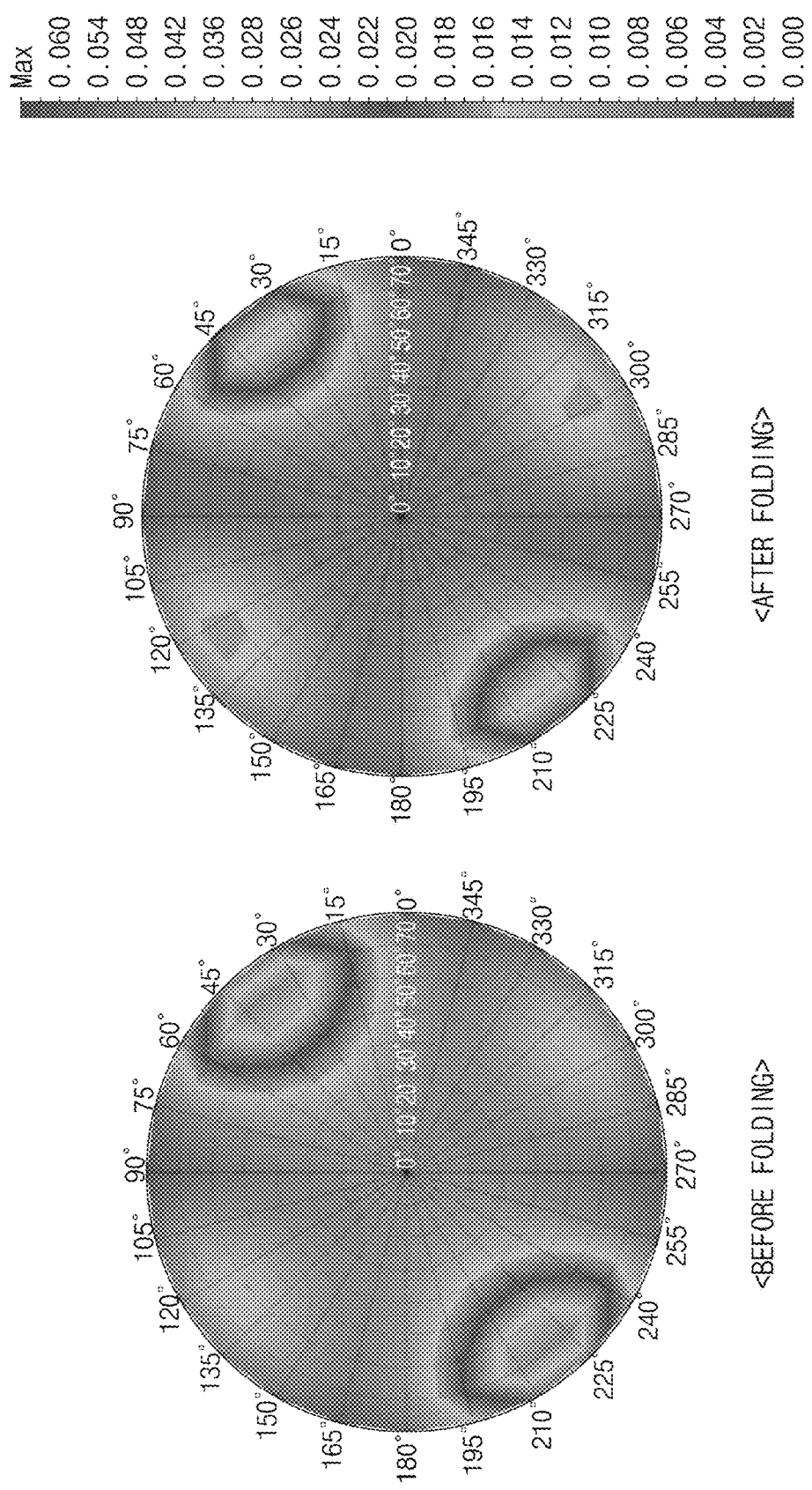
FIGS. 16 and 17 are contour plots illustrating luminance values in accordance with viewing angles in flexible display devices according to exemplary embodiments.
Figure 17:
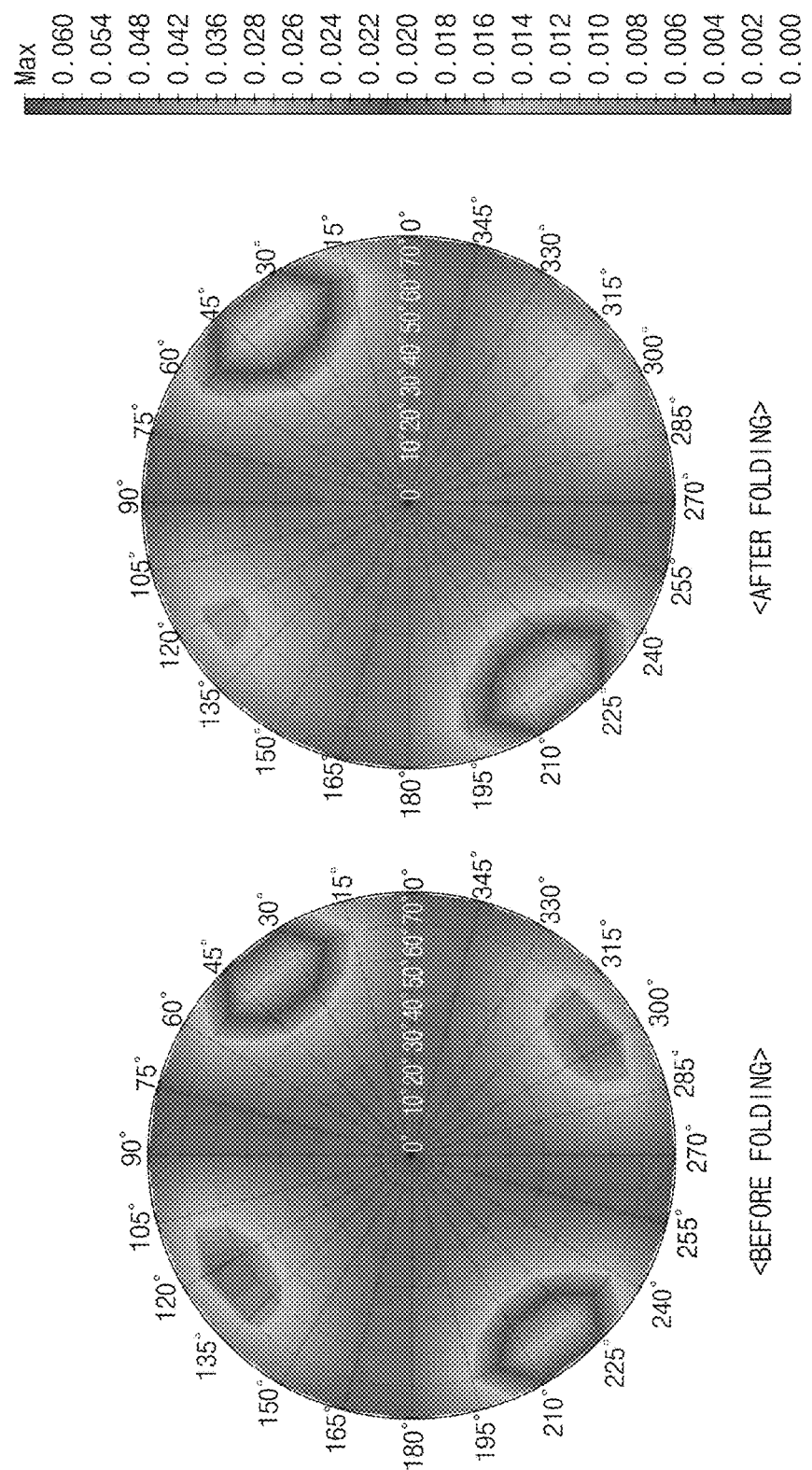

FIGS. 15 to 17 are simulation results of optical properties in a bending area before and after bending in a flexible display device.

Figure 14A:
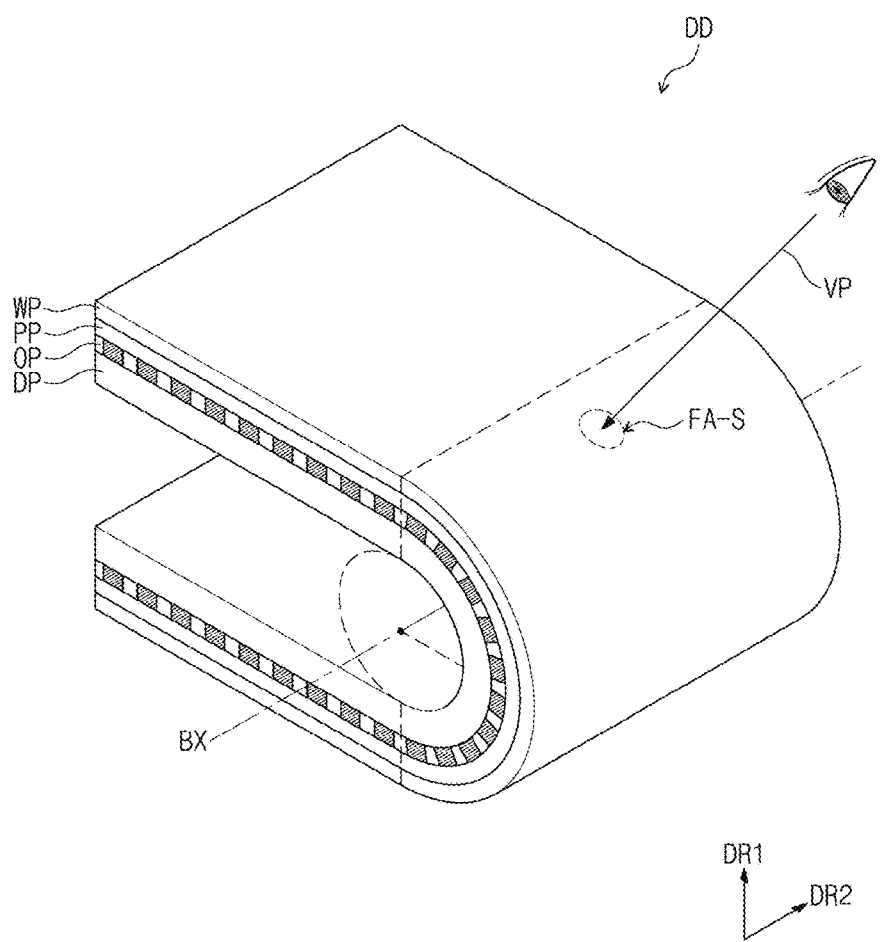
FIG. 14A is a diagram illustrating a measuring area of optical characteristic values of FIGS. 15, 16, and 17.
Figure 14B:
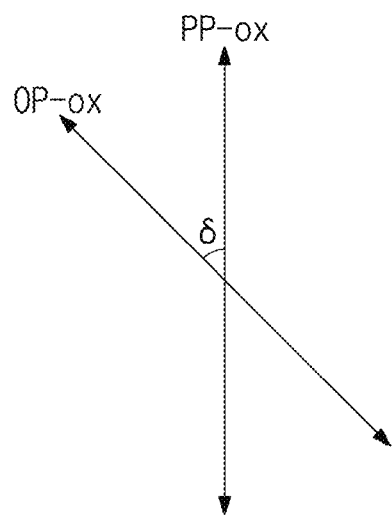
FIG. 14B is a diagram illustrating the relation between an optical axis of a polarization member and an optical axis of an optical member in an embodiment.

FIGS. 15 to 17 may illustrate luminance value according to viewing angle in a portion "FA-S" which is a portion of the bending area of the flexible display device DD shown in FIG. 14A. The luminance in accordance with viewing angle was measured by changing a view point VP where looking at the portion "FA-S" in the bending area. For example, the flexible display device of FIG. 14A may be corresponded to a case (see FIG. 14B) where an optical axis of the optical patterns of the polarization member PP and the optical member OP has an included angle of δ. In this case, the included angle δ between the absorption axis of the polarization member PP-ox and the land axis of the optical member OP-ox may be about 45 degrees.

FIG. 15 illustrates optical properties in accordance with viewing angle in a common flexible display device including an optical member having the same optical patterns in a bending area and a non-bending area. In the drawing, a portion where is relatively bright and corresponds to a high numerical in a scale bar is a portion having a relatively high luminance and exhibiting light leakage phenomenon. When comparing the optical properties before and after folding, the portion exhibiting light leakage phenomenon increased after folding. That is, the light leakage phenomenon is relatively serious in the direction of about 45 degrees and about 135 degrees before folding, but is largely shown overall in the direction of the viewing angle of about 20 degrees or more after folding.

FIG. 16 illustrates optical properties of the flexible display device according to an embodiment shown in FIG. 4. A state before folding in FIG. 16 may be corresponded to the second mode (Mode 2) of FIG. 4, and a state after folding in FIG. 16 may be corresponded to the first mode (Mode 1). The difference of the light leakage phenomena before folding and after folding is not significant. In addition, when comparing a state after folding in FIG. 15 and a state after folding in FIG. 16, the light leakage phenomenon in FIG. 16 which corresponds to the optical properties in a flexible display device according to an embodiment in a bending area during folding is improved overall when compared to that in FIG. 15. That is, in a flexible display device according to an embodiment, light leakage phenomenon generated after bending may be improved by forming an optical pattern having a trapezoidal shape in a bending area.

FIG. 17 illustrates optical properties on the flexible display device according to an embodiment shown in FIG. 5. A state before folding in FIG. 17 may be corresponded to the fourth mode (Mode 4) of FIG. 5, and a state after folding in FIG. 17 may be corresponded to the third mode (Mode 3). The difference of the light leakage phenomena before folding and after folding is not significant. In addition, when comparing a state after folding in FIG. 15 and a state after folding in FIG. 17, the light leakage phenomenon in a bending area during folding in FIG. 17 is improved overall when compared to the common flexible display device in FIG. 15. That is, in a flexible display device according to an embodiment, light leakage phenomenon generated after bending may be improved by forming an optical pattern having a revere trapezoidal shape in a bending area.

The flexible display device according to an embodiment may include a retardation layer including a plurality of optical patterns as an optical member. Particularly, the shape of the plurality of the optical patterns of the optical member may be formed different in a bending area and a non-bending area of a flexible display device. The plurality of the optical patterns of the optical member, corresponding to the bending area may be designed by reflecting the change of the retardation value in advance in consideration of the mode used of the display device. Accordingly, in a flexible display device according to an embodiment, by disposing optical patterns designed to have a width of a face adjacent to a display panel different from a width of a face adjacent to a polarization member in a bending area, optical distortion phenomenon and color shift phenomenon in the bending area may be improved even when bending and using the display device. In addition, light leakage phenomenon in an off state of a display panel or a state accomplishing black may be improved.

A flexible display device according to an embodiment includes a plurality of optical patterns modified by reflecting a retardation value to an optical member bending part, which corresponds to a bending area and is modified during bending, thereby improving color shift phenomenon in the bending area and light leakage phenomenon in an off state of the display device or during accomplishing black.

Optical distortion phenomenon induced by the modification of an optical pattern shape of an optical member during bending may be minimized by applying in an optical member bending part an optical pattern having a shape different from that in a non-bending part in consideration of a user mode of a display device.

Although the exemplary embodiments have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A flexible display device comprising a bending area and a non-bending area, the flexible display device comprising:
   a display panel configured to provide images;
   an optical member disposed on the display panel;
   a polarization member disposed on the optical member; and
   a window member disposed on the polarization member,
   wherein the optical member comprises:
   an optical member bending part corresponding to the bending area and comprising a plurality of first optical patterns; and
   an optical member non-bending part corresponding to the non-bending area and comprising a plurality of second optical patterns,
   wherein the display panel, the optical member, the polarization member and the window member are bent with respect to a bending axis in a first mode or a third mode, and unfolded in a second mode or a fourth mode,
   wherein each of the plurality of the first optical patterns in the second mode and the fourth mode comprises:
   a first face adjacent to the display panel and having a first width;
   a second face adjacent to the polarization member and having a second width which is different than the first width; and
   a side disposed between the first face and the second face.

2. The flexible display device of claim 1, wherein
   the display panel is disposed closer to the bending axis than the window member in the first mode.

3. The flexible display device of claim 2, wherein each of the plurality of the first optical patterns has the first width greater than the second width in the second mode.

4. The flexible display device of claim 1, wherein
   the window member is disposed closer to the bending axis than the display panel in the third mode.

5. The flexible display device of claim 4, wherein each of the plurality of the first optical patterns has the second width greater than the first width in the fourth mode.

6. The flexible display device of claim 1, wherein a cross section of each of the plurality of the first optical patterns is a trapezoid in the second mode and the fourth mode.

7. The flexible display device of claim 1, wherein a cross section of each of the plurality of the second optical patterns is a rectangle.

8. The flexible display device of claim 1, wherein an angle between an absorption axis of the polarization member and an optical axis of the optical member is from about 45 degrees.

9. The flexible display device of claim 1, further comprising a touch sensing unit between the display panel and the optical member.

10. The flexible display device of claim 1, further comprising at least one adhesive between the display panel and the polarization member.

11. A flexible display device comprising a bending area and a non-bending area, the flexible display device comprising:
    a display panel configured to provide images;
    an optical member disposed on the display panel;
    a polarization member disposed on the optical member; and
    a window member disposed on the polarization member,
    wherein the optical member comprises:
    an optical member bending part corresponding to the bending area and comprising a plurality of first optical patterns; and
    an optical member non-bending part corresponding to the non-bending area and comprising a plurality of second optical patterns, wherein each of the plurality of the first optical patterns comprises:
a first face adjacent to the display panel and having a first width;
a second face adjacent to the polarization member and having a second width which is different than the first width; and
a side disposed between the first face and the second face, wherein the display panel comprises a plurality of pixels,
the plurality of the first optical patterns are disposed in one-to-one correspondence with the plurality of pixels in the bending area, and
the plurality of the second optical patterns are disposed in one-to-one correspondence with the plurality of pixels in the non-bending area.

12. The flexible display device of claim 11, wherein the plurality of the pixels comprises a first pixel configured to show a first color, a second pixel configured to show a second color and a third pixel configured to show co a third color,
the plurality of the first optical patterns comprises:
a first sub optical pattern disposed corresponding to the first pixel;
a second sub optical pattern disposed corresponding to the second pixel; and
a third sub optical pattern disposed corresponding to the third pixel, and
heights of the first, second, and third sub optical patterns are different than each other.

13. The flexible display device of claim 11, wherein the plurality of the pixels comprises a first pixel configured to show a first color, a second pixel configured to show a second color, and a third pixel configured to show a third color,
the plurality of the first optical patterns comprises:
a first sub optical pattern disposed corresponding to the first pixel;
a second sub optical pattern disposed corresponding to the second pixel; and
a third sub optical pattern disposed corresponding to the third pixel,
the plurality of the second optical patterns comprises:
a fourth sub optical pattern disposed corresponding to the first pixel;
a fifth sub optical pattern disposed corresponding to the second pixel; and
a sixth sub optical pattern disposed corresponding to the third pixel,
the first sub optical pattern has a retardation value greater than a retardation value of the fourth sub optical pattern,
the second sub optical pattern has a retardation value greater than a retardation value of the fifth sub optical pattern, and
the third sub optical pattern has a retardation value greater than a retardation value of the sixth sub optical pattern.

14. The flexible display device of claim 12, wherein the first color, the second color, and the third color are red, green, and blue, respectively.

15. The flexible display device of claim 14, wherein the heights of the first, second, and third sub optical patterns are t1, t2, and t3, respectively, where t1>t2>t3.

16. A flexible display device comprising a bending area and a non-bending area, the flexible display device comprising:
a display panel configured to provide images;
an optical member disposed on the display panel, wherein the optical member is a $\lambda/4$ retardation layer;
a polarization member disposed on the optical member; and
a window member disposed on the polarization member,
wherein the optical member comprises:
an optical member bending part corresponding to the bending area and comprising a plurality of first optical patterns; and
an optical member non-bending part corresponding to the non-bending area and comprising a plurality of second optical patterns,
wherein each of the plurality of the first optical patterns comprises:
a first face adjacent to the display panel and having a first width;
a second face adjacent to the polarization member and having a second width which is different than the first width; and
a side disposed between the first face and the second face.

17. The flexible display device of claim 16, wherein the $\lambda/4$ retardation layer has a reverse wavelength dispersibility.

18. The flexible display device of claim 16, further comprising a positive c plate between the optical member and the display panel.

19. The flexible display device of claim 16, further comprising a $\lambda/2$ retardation layer between the optical member and the polarization member.

* * * * *